US012520472B2

United States Patent
Lee et al.

(10) Patent No.: US 12,520,472 B2
(45) Date of Patent: Jan. 6, 2026

(54) SEMICONDUCTOR MEMORY DEVICE

(71) Applicant: SAMSUNG ELECTRONICS CO., LTD., Suwon-si (KR)

(72) Inventors: Kiseok Lee, Hwaseong-si (KR); Taegyu Kang, Suwon-si (KR); Keunnam Kim, Yongin-si (KR); Sung-Min Park, Seongnam-si (KR); Taehyun An, Seoul (KR); Sanghyun Lee, Seoul (KR); Eunsuk Jang, Hwaseong-si (KR); Moonyoung Jeong, Suwon-si (KR); Euichul Jeong, Yongin-si (KR); Hyungeun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 587 days.

(21) Appl. No.: 17/956,102

(22) Filed: Sep. 29, 2022

(65) Prior Publication Data

US 2023/0180452 A1     Jun. 8, 2023

(30) Foreign Application Priority Data

Dec. 7, 2021   (KR) .................. 10-2021-0174178

(51) Int. Cl.
  *H10B 12/00*   (2023.01)
  *G11C 5/04*    (2006.01)
  (Continued)

(52) U.S. Cl.
  CPC .............. *H10B 12/00* (2023.02); *G11C 5/04* (2013.01); *G11C 7/18* (2013.01); *G11C 8/14* (2013.01);
  (Continued)

(58) Field of Classification Search
  None
  See application file for complete search history.

(56) References Cited

U.S. PATENT DOCUMENTS

| 6,075,265 A | 6/2000 | Goebel et al. |
| 7,956,387 B2 | 6/2011 | Schloesser |
| (Continued) | | |

FOREIGN PATENT DOCUMENTS

| JP | 2006-060208 A | 3/2006 |
| KR | 10-2019-0080688 A | 7/2019 |
| (Continued) | | |

*Primary Examiner* — Nicholas J Tobergte
*Assistant Examiner* — William Henry Anderson
(74) *Attorney, Agent, or Firm* — Muir Patent Law, PLLC

(57) ABSTRACT

A semiconductor memory device includes a word line extended parallel to a top surface of a semiconductor substrate, a channel pattern crossing the word line and having a long axis parallel to the top surface, a bit line extended perpendicular to the top surface and in contact with a first side surface of the channel pattern, and a data storage element in contact with a second side surface of the channel pattern opposite to the first side surface. The channel pattern includes a first dopant region adjacent to the bit line, a second dopant region adjacent to the data storage element, and a channel region between the first and second dopant regions and overlapped with the word line. At least one of the first and second dopant regions includes a low concentration region adjacent to the channel region, and a high concentration region spaced apart from the channel region.

20 Claims, 48 Drawing Sheets

(51) Int. Cl.
  *G11C 7/18* (2006.01)
  *G11C 8/14* (2006.01)
(52) U.S. Cl.
  CPC ............. *H10B 12/03* (2023.02); *H10B 12/05* (2023.02); *H10B 12/482* (2023.02); *H10B 12/488* (2023.02)

(56) References Cited

U.S. PATENT DOCUMENTS

| | | | |
|---|---|---|---|
| 10,468,414 | B2 | 11/2019 | Kim et al. |
| 10,784,272 | B2 | 9/2020 | Lee et al. |
| 10,861,854 | B2 | 12/2020 | Kim et al. |
| 11,094,699 | B1 | 8/2021 | Brewer et al. |
| 11,158,716 | B2 | 10/2021 | Son et al. |
| 2018/0212055 | A1* | 7/2018 | Chen ................... H10B 12/485 |
| 2019/0103407 | A1* | 4/2019 | Kim ..................... H10B 12/30 |
| 2019/0206869 | A1* | 7/2019 | Kim ..................... H10B 12/20 |
| 2020/0168611 | A1* | 5/2020 | Jeon .................... H10B 12/482 |
| 2020/0220013 | A1* | 7/2020 | Yoon .................... H10D 30/603 |
| 2020/0227418 | A1 | 7/2020 | Kim et al. |
| 2020/0251151 | A1 | 8/2020 | Kang et al. |
| 2020/0279601 | A1* | 9/2020 | Kim .................... G11C 11/4097 |
| 2021/0012828 | A1* | 1/2021 | Kim .................... G11C 11/4097 |
| 2021/0183861 | A1 | 6/2021 | Lee et al. |
| 2021/0233928 | A1 | 7/2021 | Lee |
| 2021/0242210 | A1 | 8/2021 | Lee |
| 2021/0257366 | A1* | 8/2021 | Lee ....................... H10B 12/50 |
| 2022/0246619 | A1* | 8/2022 | Kim ................... H10D 30/6741 |
| 2023/0157003 | A1* | 5/2023 | Lee ....................... H10B 12/05 257/296 |

FOREIGN PATENT DOCUMENTS

| | | |
|---|---|---|
| KR | 10-2020-0105216 A | 9/2020 |
| TW | 419821 B | 1/2001 |
| TW | I452697 B | 9/2014 |
| TW | 202118052 A | 5/2021 |

* cited by examiner

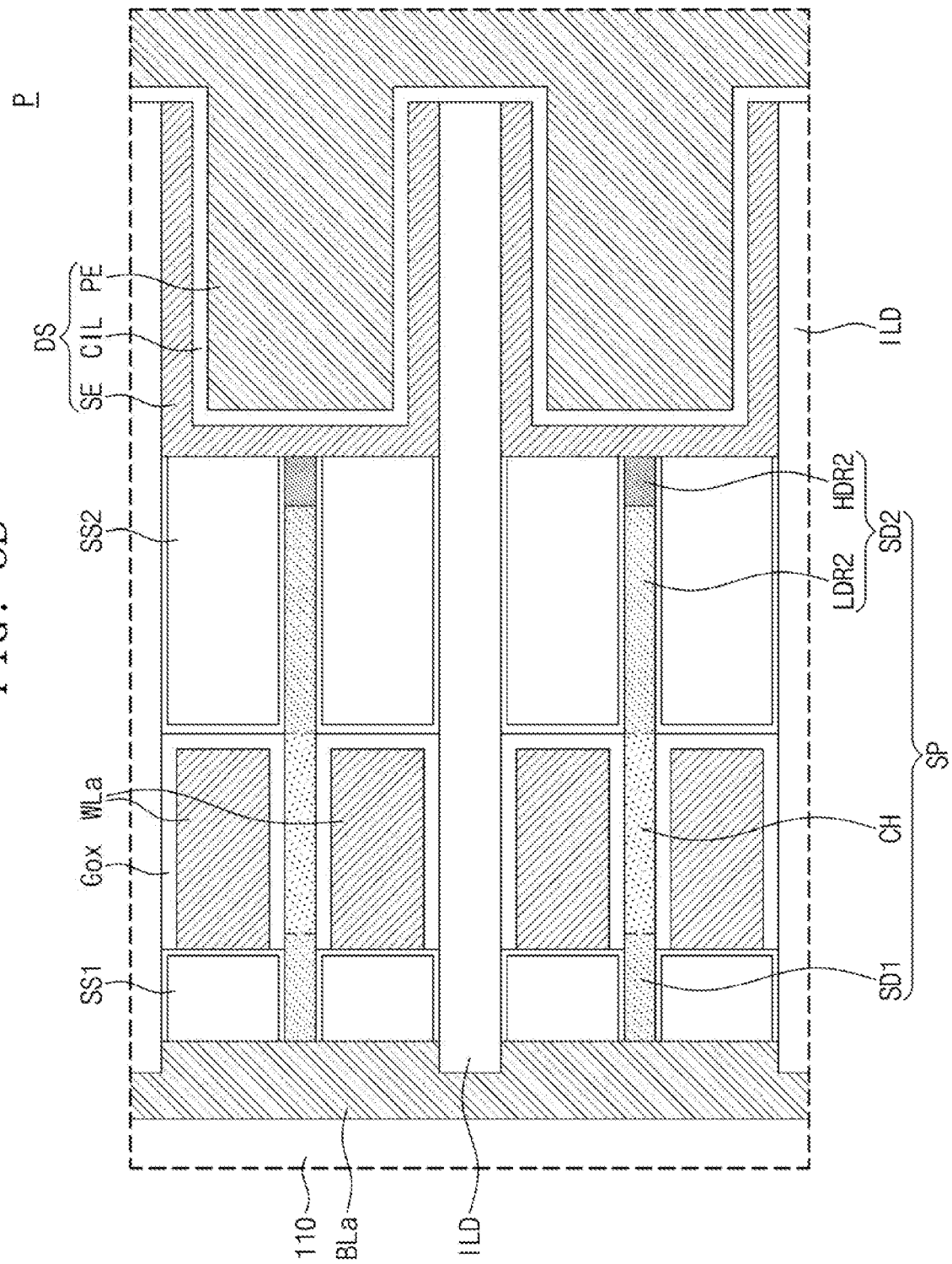

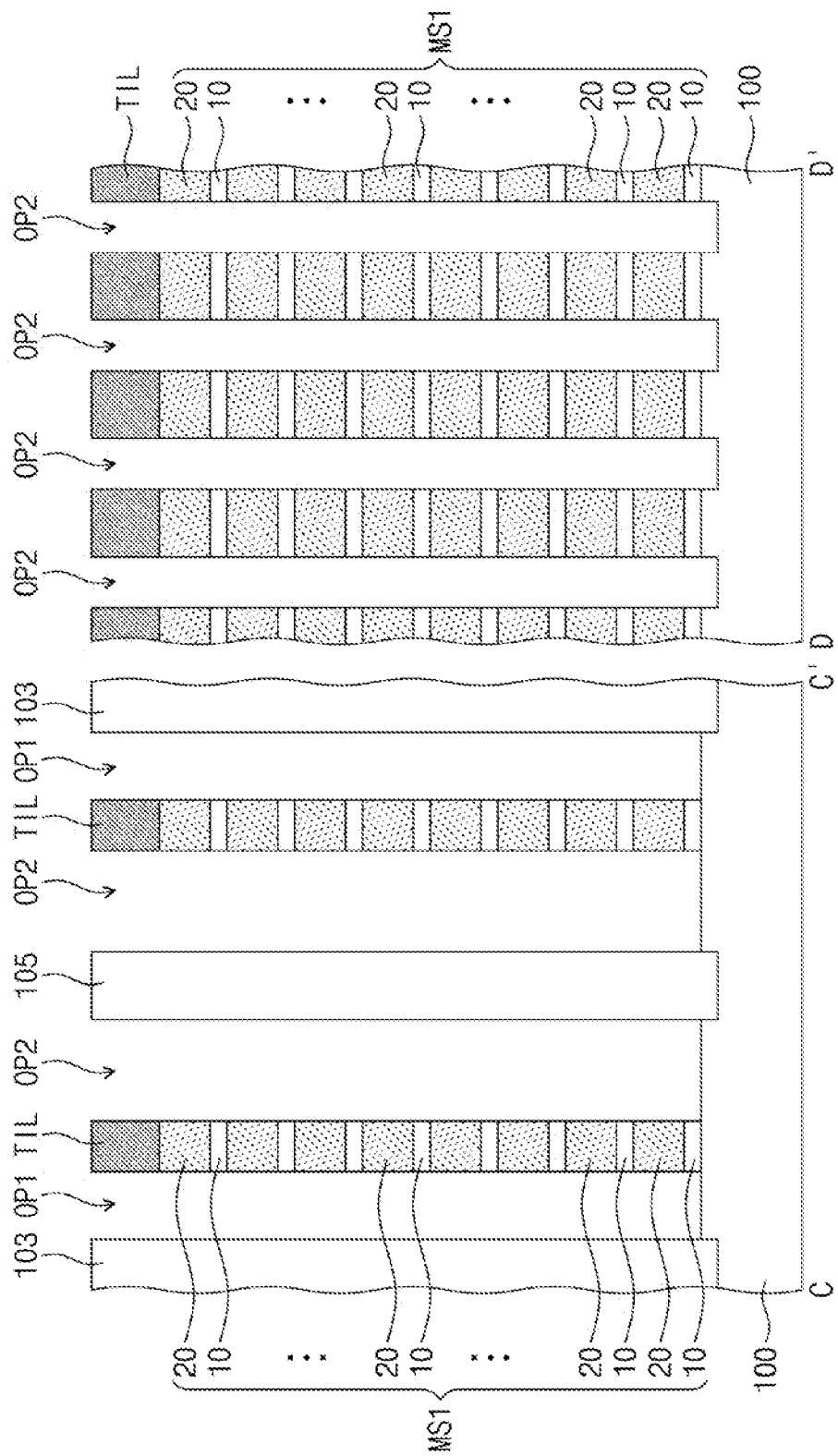

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2021-0174178, filed on Dec. 7, 2021, in the Korean Intellectual Property Office, the entire contents of which are hereby incorporated by reference.

BACKGROUND

1. Field

Embodiments relate to a semiconductor memory device.

2. Description of the Related Art

Higher integration of semiconductor devices is required to satisfy consumer demands for superior performance and inexpensive prices. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

According to an embodiment, a semiconductor memory device may include a word line, which is extended in a first direction parallel to a top surface of a semiconductor substrate, a channel pattern, which is provided to cross the word line and to have a long axis in a second direction parallel to the top surface of the semiconductor substrate, a bit line, which is extended in a third direction perpendicular to the top surface of the semiconductor substrate and is in contact with a first side surface of the channel pattern, and a data storage element, which is in contact with a second side surface of the channel pattern opposite to the first side surface. The channel pattern may include a first dopant region adjacent to the bit line, a second dopant region adjacent to the data storage element, and a channel region provided between the first and second dopant regions and overlapped with the word line. At least one of the first and second dopant regions may include a low concentration region, which is adjacent to the channel region, and a high concentration region, which is spaced apart from the channel region.

According to an embodiment, a semiconductor memory device may include a stack including word lines and interlayer insulating patterns, which are alternatingly stacked on a semiconductor substrate, the word lines being extended in a first direction parallel to a top surface of the semiconductor substrate, channel patterns, which are provided to cross the word lines and to have a long axis in a second direction and are disposed on the semiconductor substrate to be spaced apart from each other in the first direction and in a third direction perpendicular to the top surface of the semiconductor substrate, bit lines, which are extended in the third direction and are spaced apart from each other in the first direction, and each of which is in contact with first side surfaces of the channel patterns spaced apart from each other in the third direction, and data storage elements, which are respectively provided between vertically adjacent ones of the interlayer insulating patterns and are in contact with second side surfaces of the channel patterns opposite to the first side surfaces. Each of the channel patterns may include a first dopant region adjacent to the bit lines, a second dopant region adjacent to the data storage elements, and a channel region provided between the first and second dopant regions and overlapped with the word lines. The second dopant region may include a low concentration region adjacent to the channel region and a high concentration region in contact with the data storage element. A length of the low concentration region may be larger than a length of the high concentration region, when measured in the second direction.

According to an embodiment, a semiconductor memory device may include first and second stacks disposed on a semiconductor substrate, each of the first and second stacks including word lines, which are extended in a first direction and are stacked on the semiconductor substrate with interlayer insulating patterns interposed therebetween, channel patterns, which are provided to cross the word lines and to have a long axis in a second direction and are disposed on the semiconductor substrate to be spaced apart from each other in the first and second directions and in a third direction perpendicular to a top surface of the semiconductor substrate, bit lines, which are extended in the third direction and are spaced apart from each other in the first direction, the bit lines including first bit lines crossing the word lines of the first stack and second bit lines crossing the word lines of the second stack, first storage electrodes, which are respectively provided between the interlayer insulating patterns of the first stack, second storage electrodes, which are respectively provided between the interlayer insulating patterns of the second stack, a plate electrode, which is provided between the first and second stacks to cover the first and second storage electrodes in common, a dielectric layer between the first and second storage electrodes and the plate electrode, first insulating isolation patterns, which are spaced apart from each other in the first direction and are provided between the first bit lines and between the second bit lines, and second insulating isolation patterns, which are spaced apart from each other in the first direction and are provided between the first storage electrodes and between the second storage electrodes. Each of the channel patterns may include a first dopant region adjacent to the bit lines, a second dopant region adjacent to the data storage elements, and a channel region provided between the first and second dopant regions and overlapped with the word lines. At least one of the first and second dopant regions may include a low concentration region, which is adjacent to the channel region, and a high concentration region, which is spaced apart from the channel region.

BRIEF DESCRIPTION OF THE DRAWINGS

Features will become apparent to those of skill in the art by describing in detail example embodiments with reference to the attached drawings in which:

FIGS. 3A and 3B are enlarged sectional views illustrating a portion 'P' of FIG. 2B.

FIGS. 5A to 13A are plan views illustrating a method of fabricating a semiconductor memory device according to an example embodiment.

FIGS. 5B to 13B are sectional views, which are taken along lines A-A' and B-B' of FIGS. 5A to 13A, respectively, to illustrate a method of fabricating a semiconductor memory device according to an example embodiment.

FIGS. 5C to 13C are sectional views, which are taken along lines C-C' and D-D' of FIGS. 5A to 13A, respectively, to illustrate a method of fabricating a semiconductor memory device according to an example embodiment.

FIGS. 5D to 13D are perspective views illustrating a method of fabricating a semiconductor memory device according to an example embodiment.

DETAILED DESCRIPTION

Figure 1:
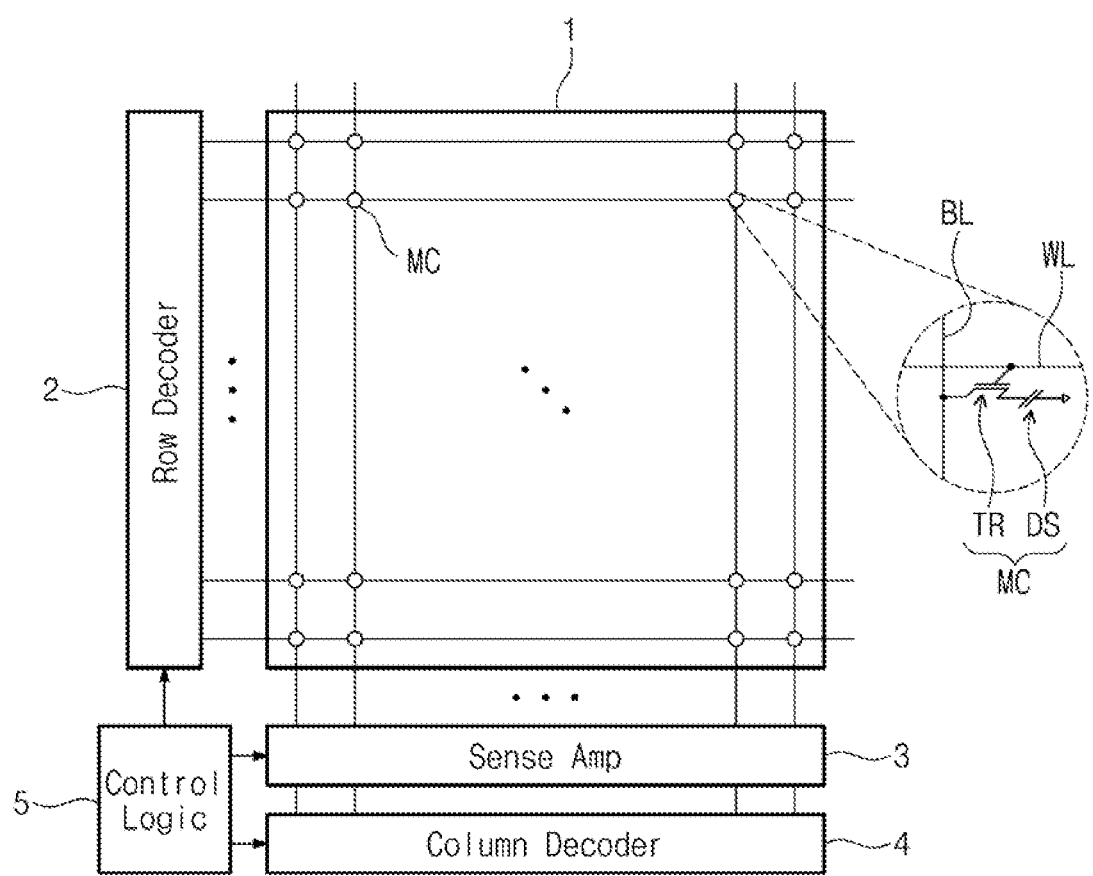
FIG. 1 is a block diagram illustrating a semiconductor memory device according to an example embodiment.

FIG. 1 is a block diagram illustrating a semiconductor memory device according to an example embodiment.

Referring to FIG. 1, a semiconductor memory device may include a memory cell array 1, a row decoder 2, a sensing amplifier 3, a column decoder 4, and a control logic 5.

The memory cell array 1 may include a plurality of memory cells MC, which are three-dimensionally arranged. Each of the memory cells MC may be provided between and connected to a word line WL and a bit line BL, which are disposed to cross each other.

Each of the memory cells MC may include a selection element TR and a data storage element DS, which are electrically connected to each other in series. The selection element TR may be a field effect transistor (FET), and the data storage element DS may be realized with a capacitor, a variable resistor, or the like. As an example, the selection element TR may include a transistor whose gate electrode is connected to the word line WL and whose drain/source terminals are connected to the bit line BL and the data storage element DS, respectively.

The row decoder 2 may be configured to decode address information, which is input from the outside, and to select one of the word lines WL of the memory cell array 1, based on the decoded address information. The address information decoded by the row decoder 2 may be provided to a row driver (not shown), and in this case, the row driver may provide respective voltages to the selected one of the word lines WL and the unselected ones of the word lines WL, in response to the control of a control circuit.

The sensing amplifier 3 may be configured to sense, amplify, and output a difference in voltage between one of the bit lines BL, which is selected based on address information decoded by the column decoder 4, and a reference bit line.

The column decoder 4 may provide a data transmission path between the sensing amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data-writing or data-reading operations on the memory cell array 1.

Figure 2A:
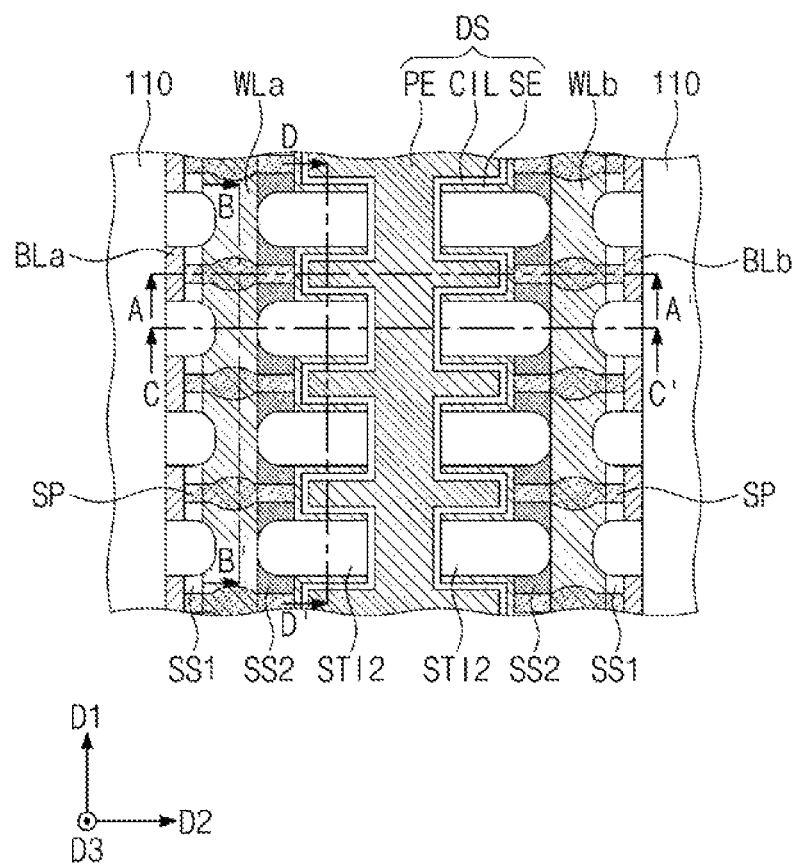
FIG. 2A is a plan view illustrating a semiconductor memory device according to an example embodiment.
Figure 2B:
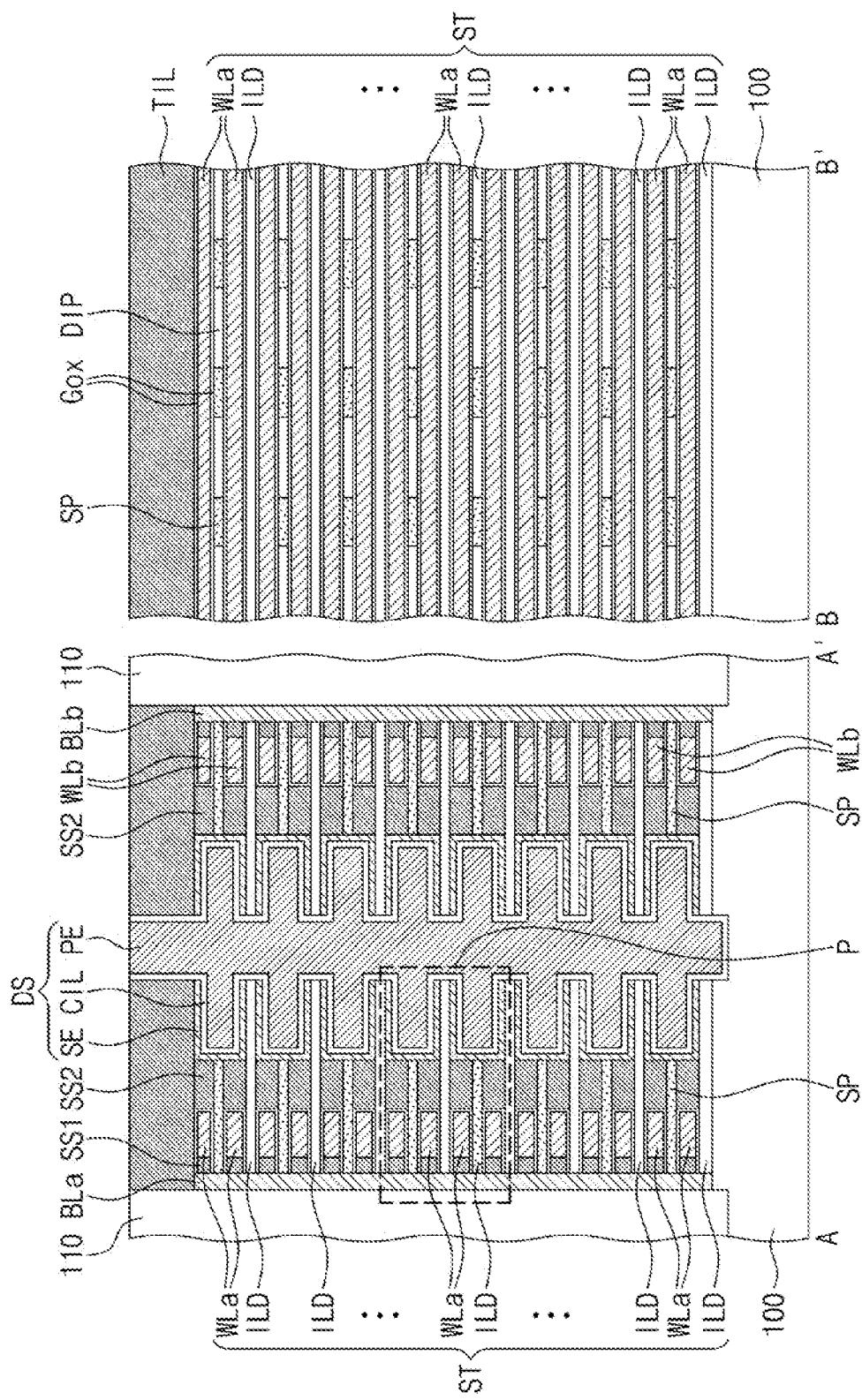
FIG. 2B is a sectional view, which is taken along lines A-A' and B-B' of FIG. 2A to illustrate a cell array structure of a semiconductor memory device according to an example embodiment.
Figure 2C:
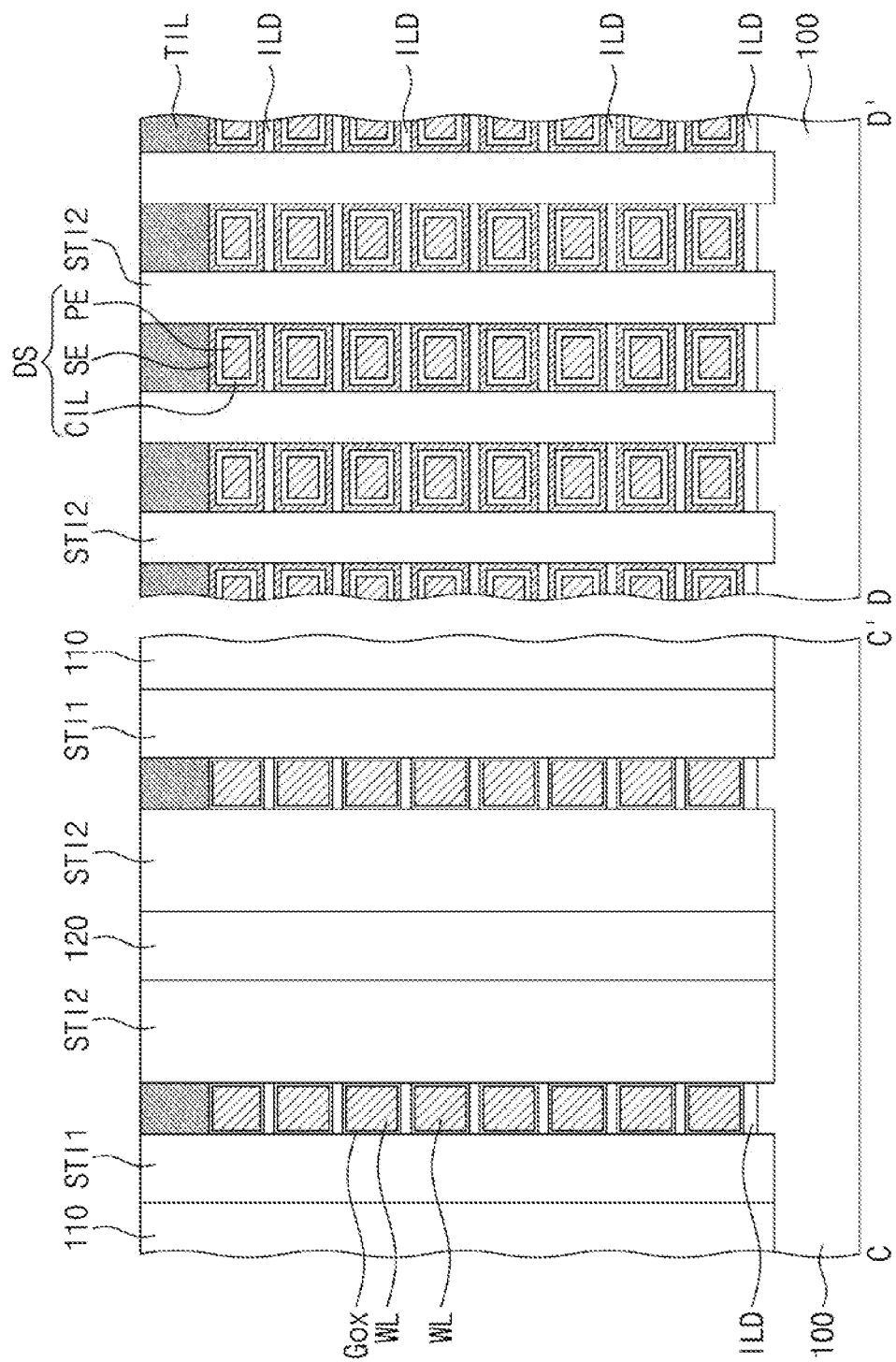
FIG. 2C is a sectional view, which is taken along lines C-C' and D-D' of FIG. 2A to illustrate a cell array structure of a semiconductor memory device according to an example embodiment.
Figure 3A:
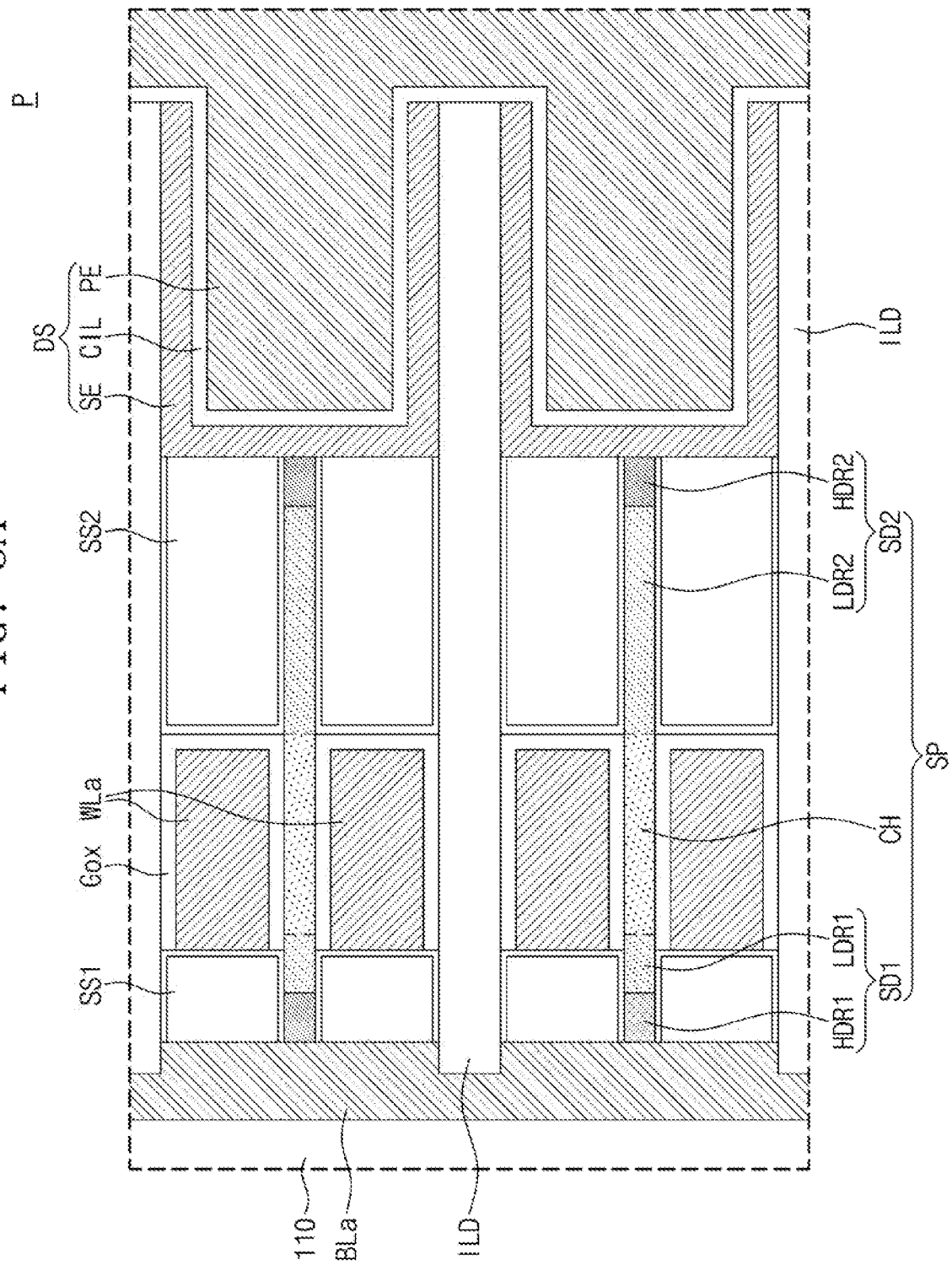
Figure 4:
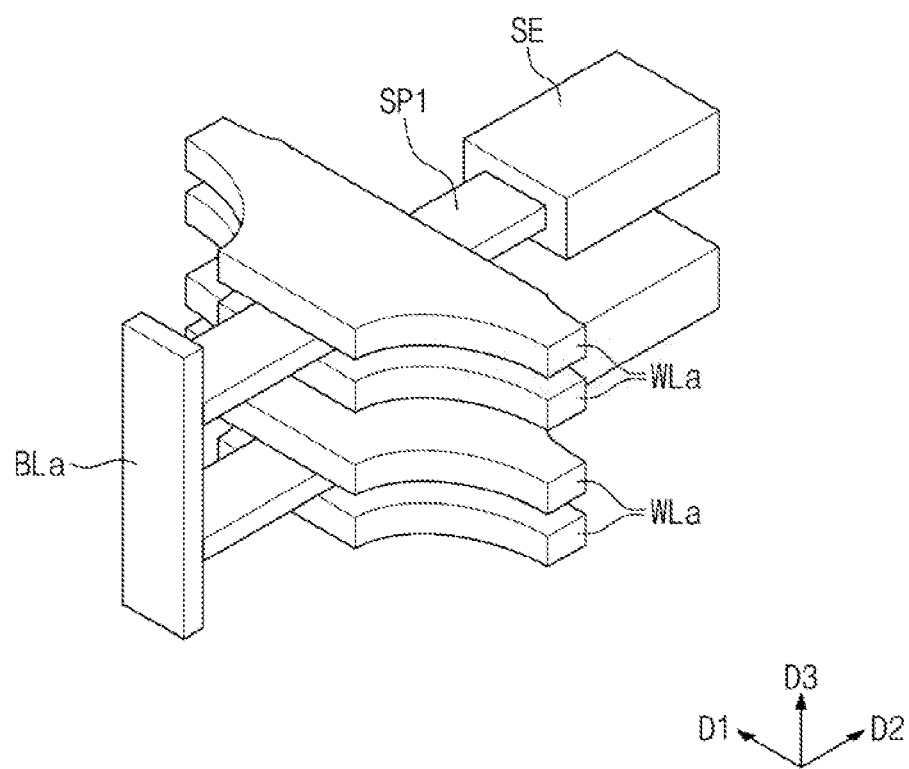
FIG. 4 is a perspective view illustrating a portion of a semiconductor memory device according to an example embodiment.
Figure 5A:
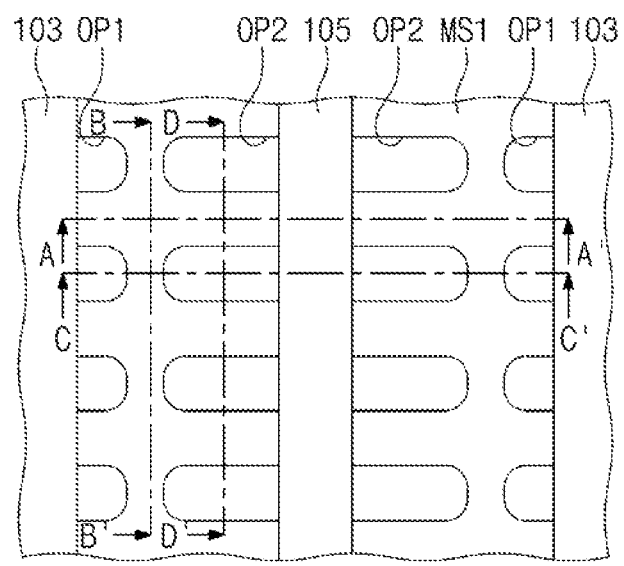
Figure 5A:
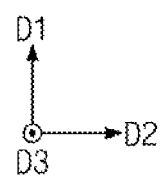
Figure 5B:
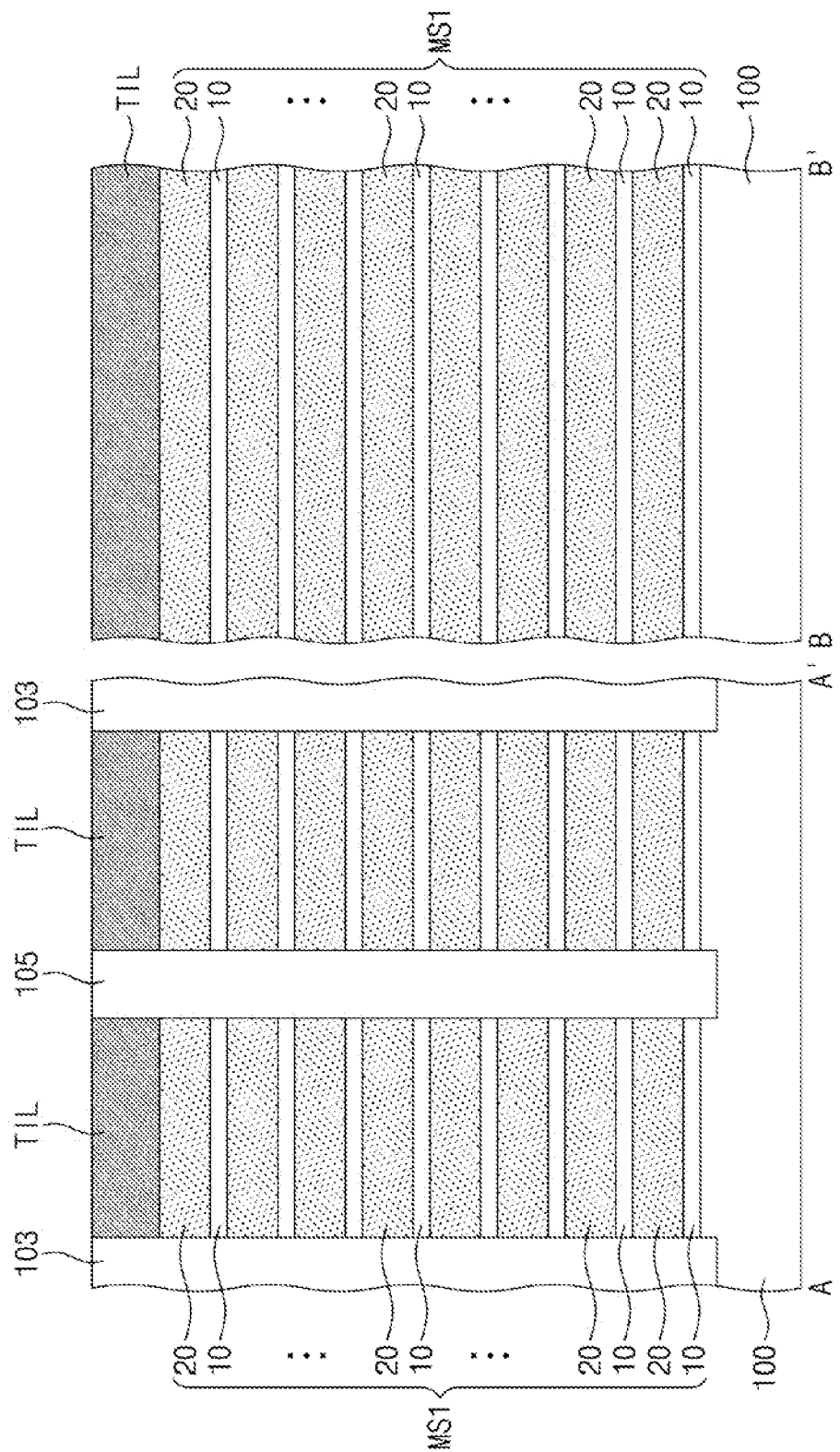
Figure 5D:
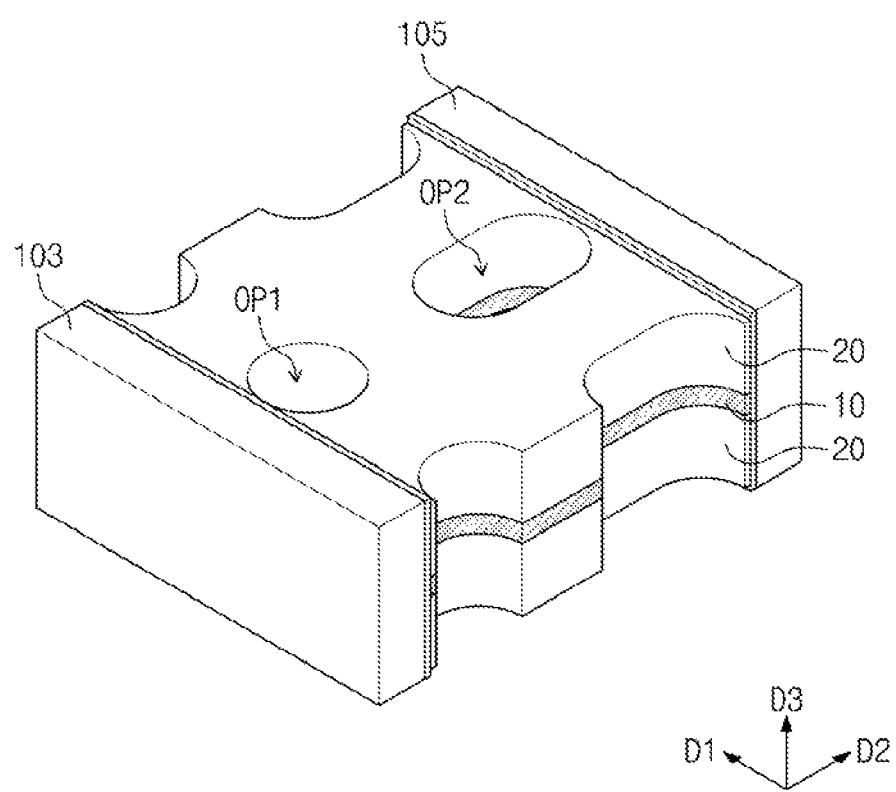
Figure 6A:
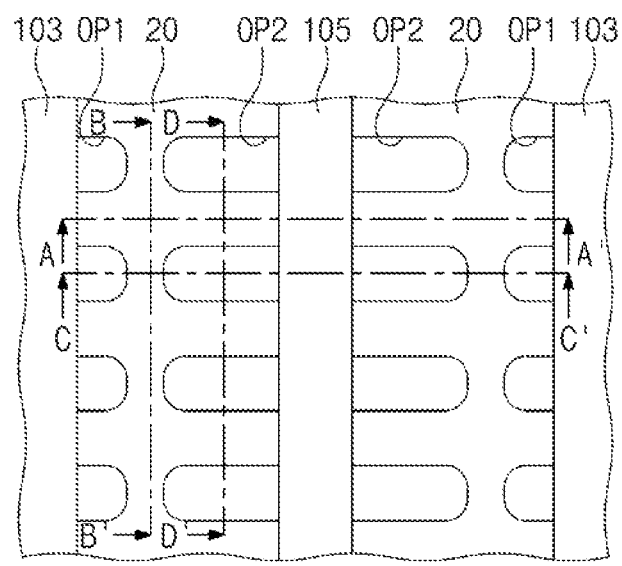
Figure 6A:
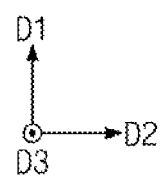
Figure 6B:
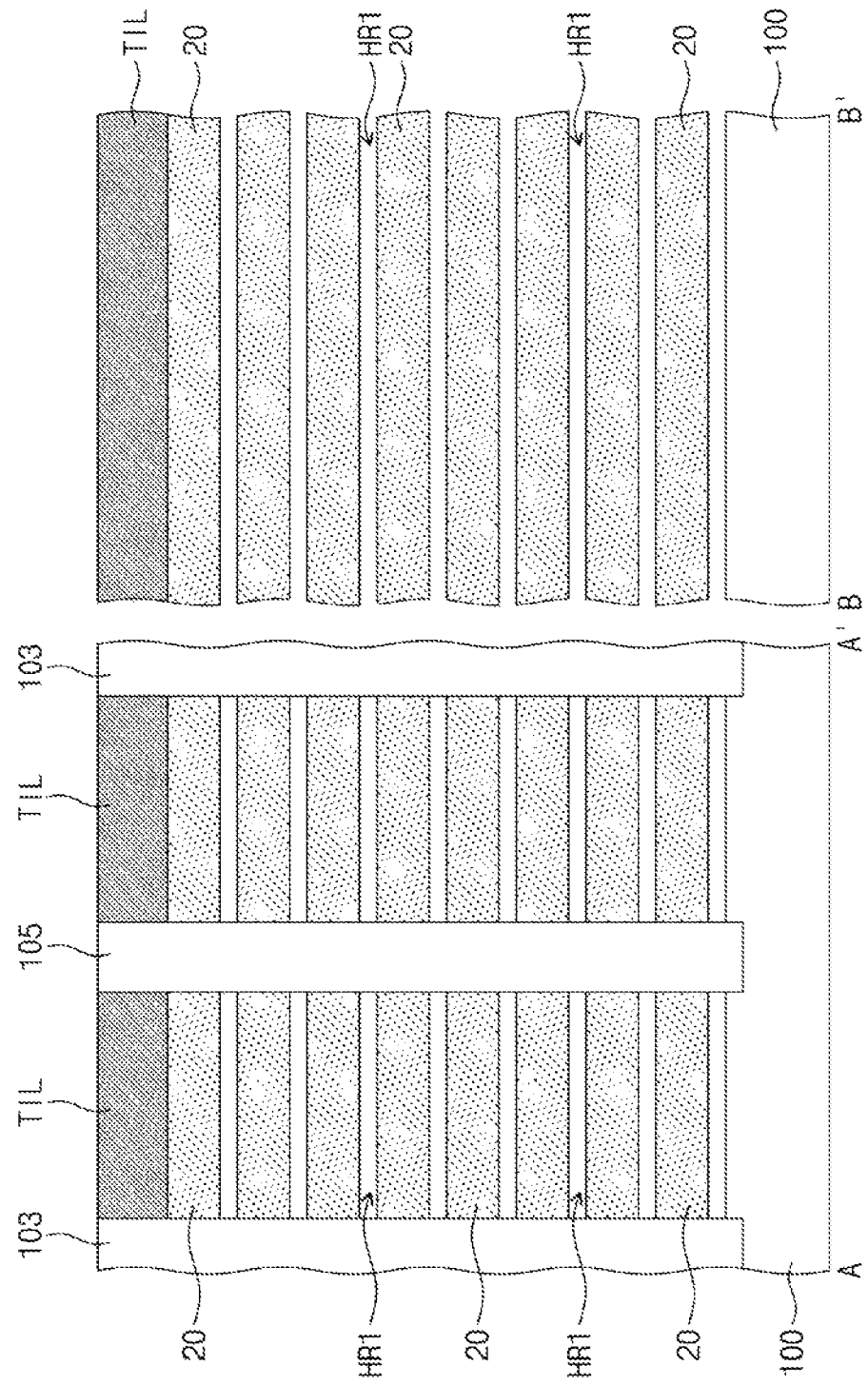
Figure 6C:
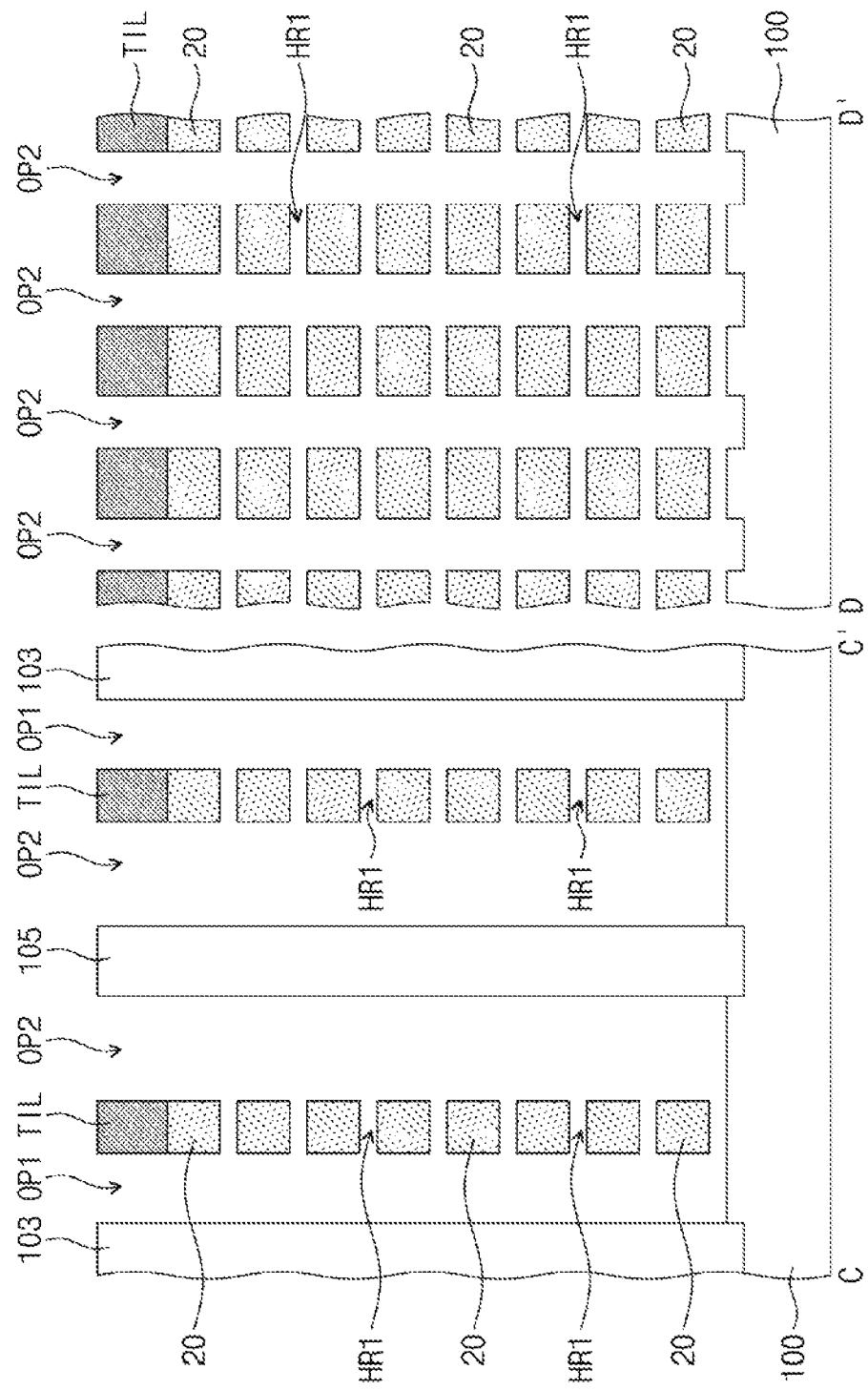
Figure 6D:
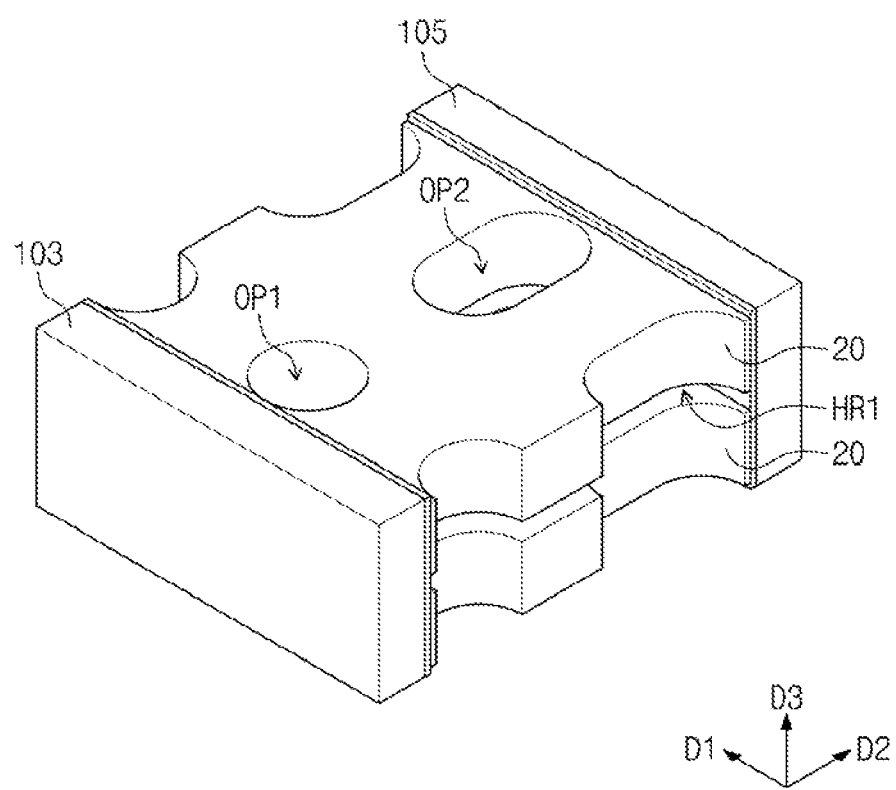
Figure 7A:
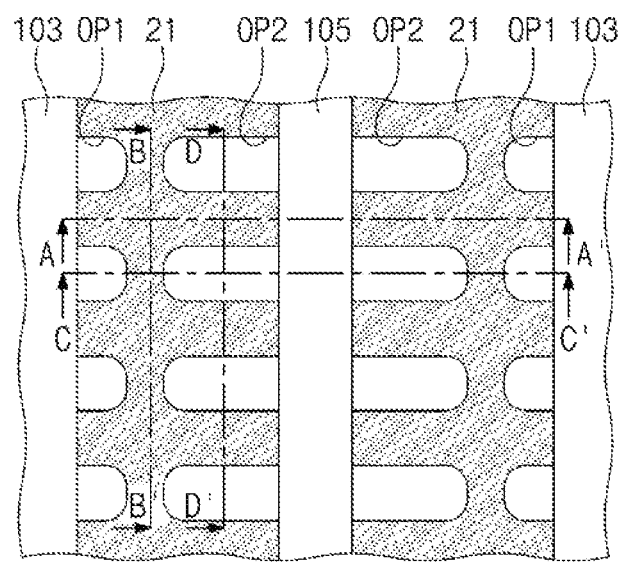
Figure 7B:
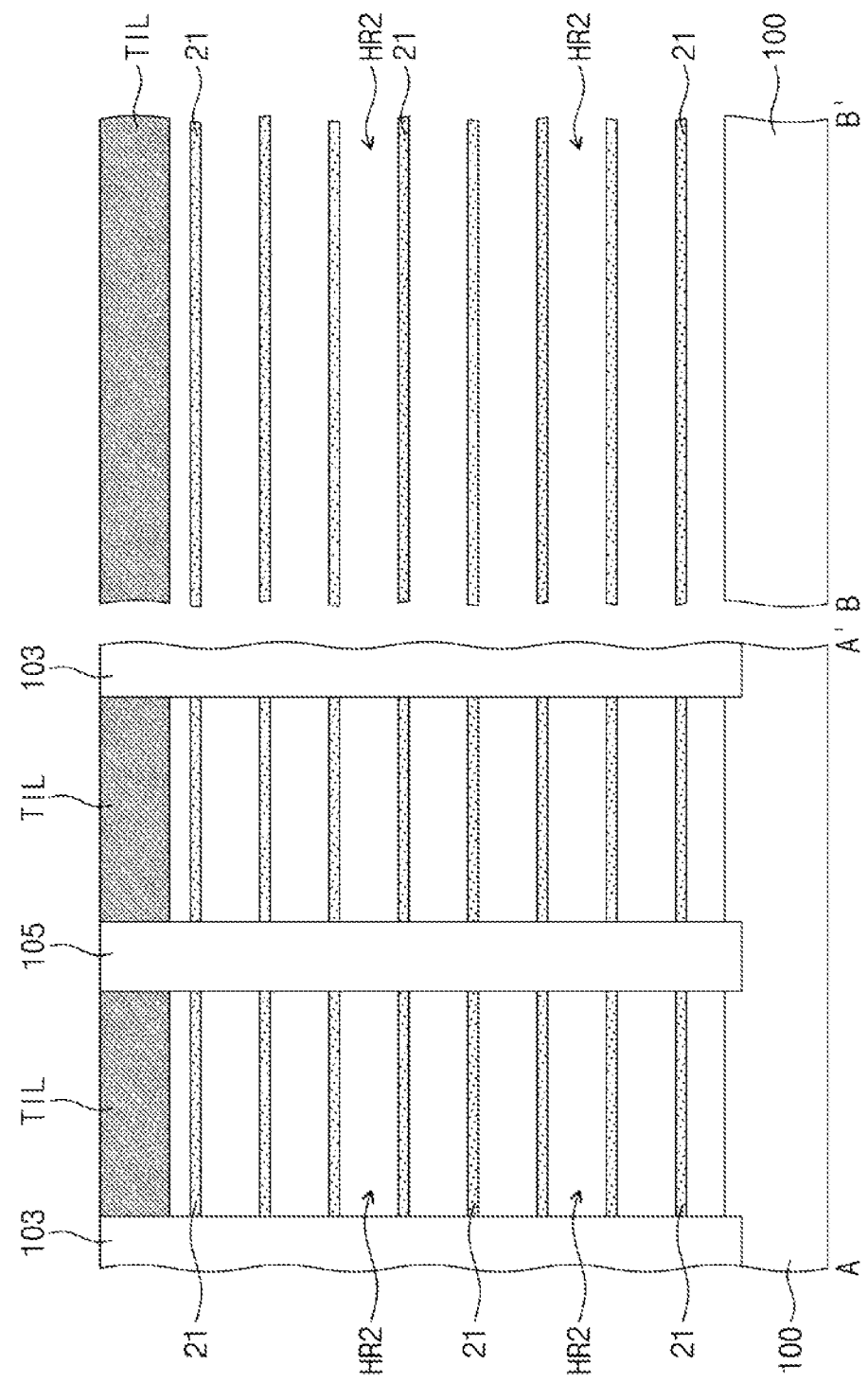
Figure 7C:
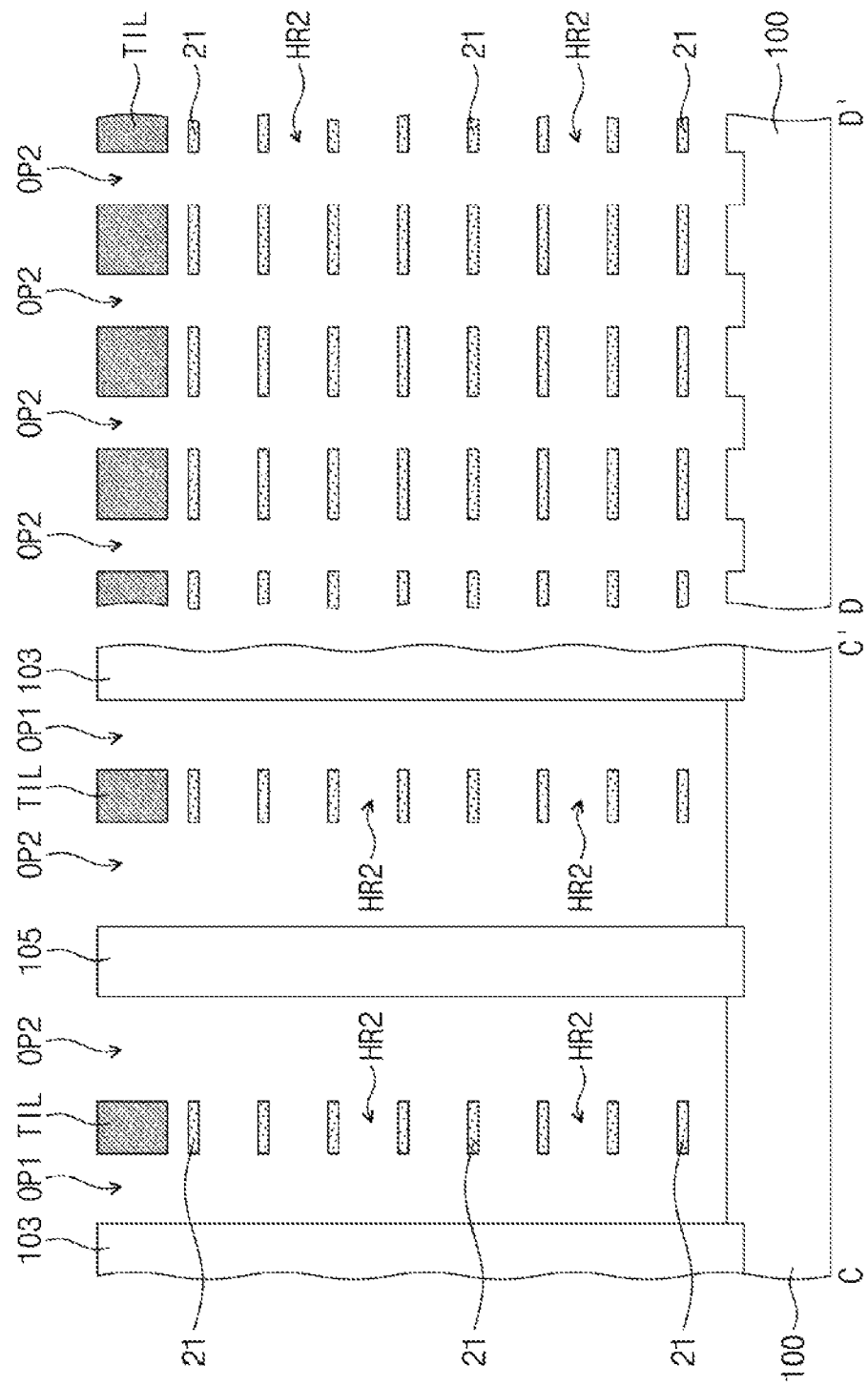
Figure 7D:
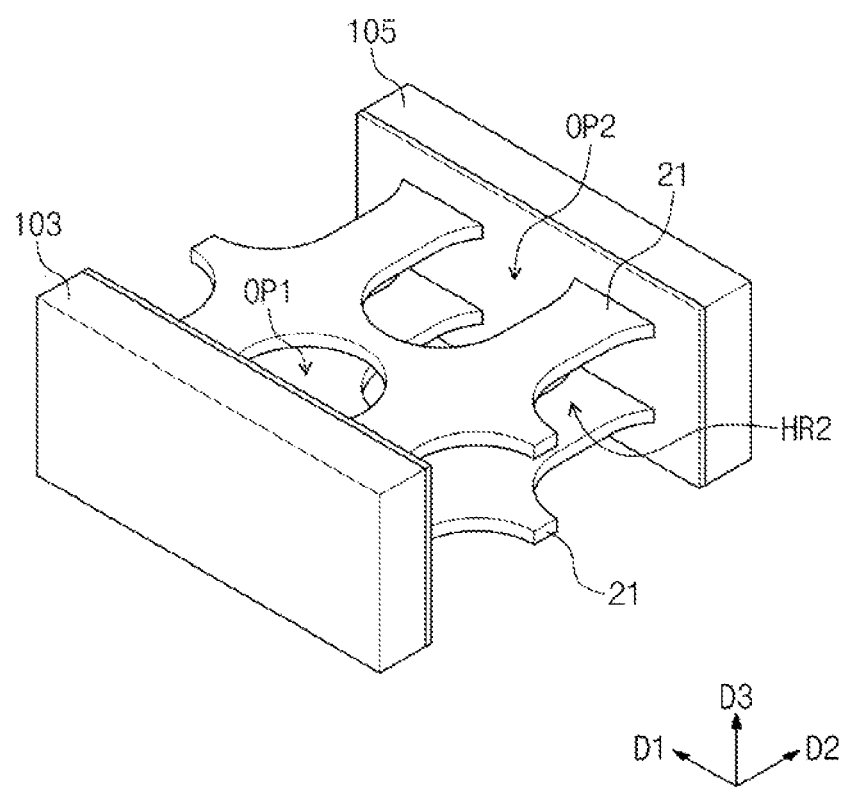
Figure 8A:
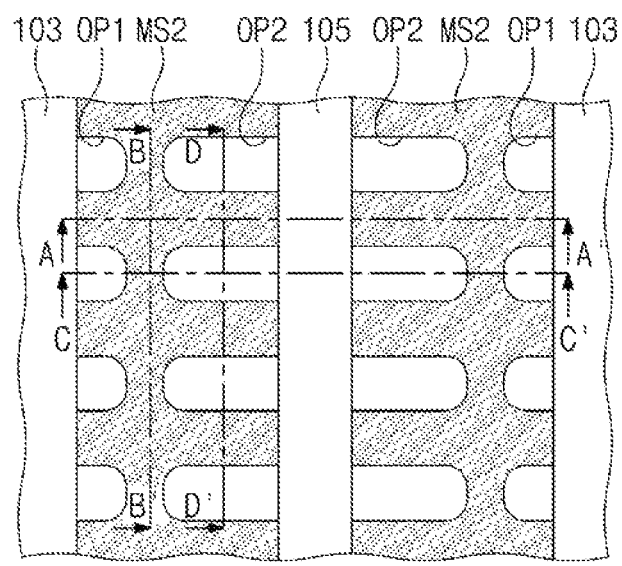
Figure 8B:
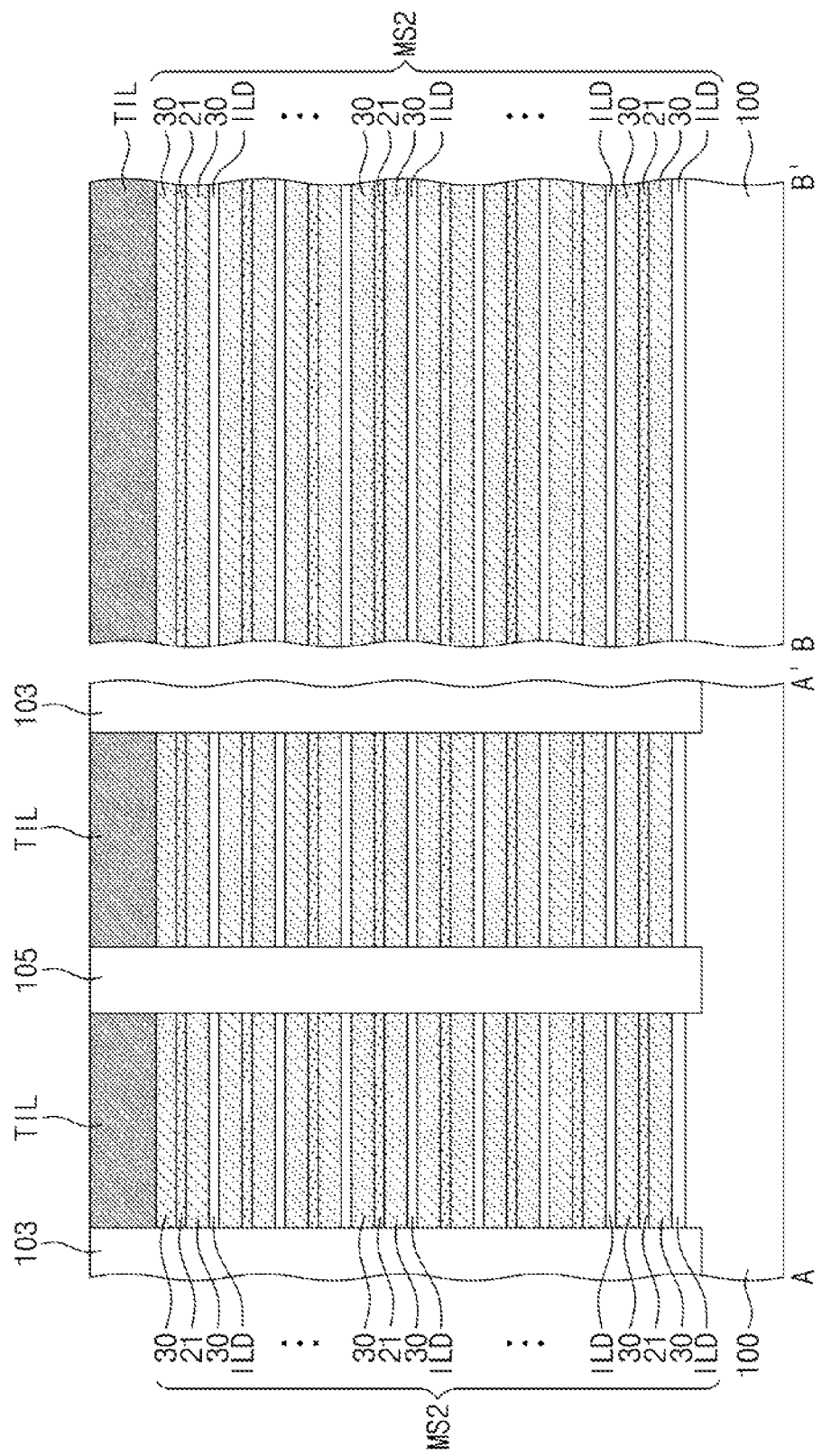
Figure 8C:
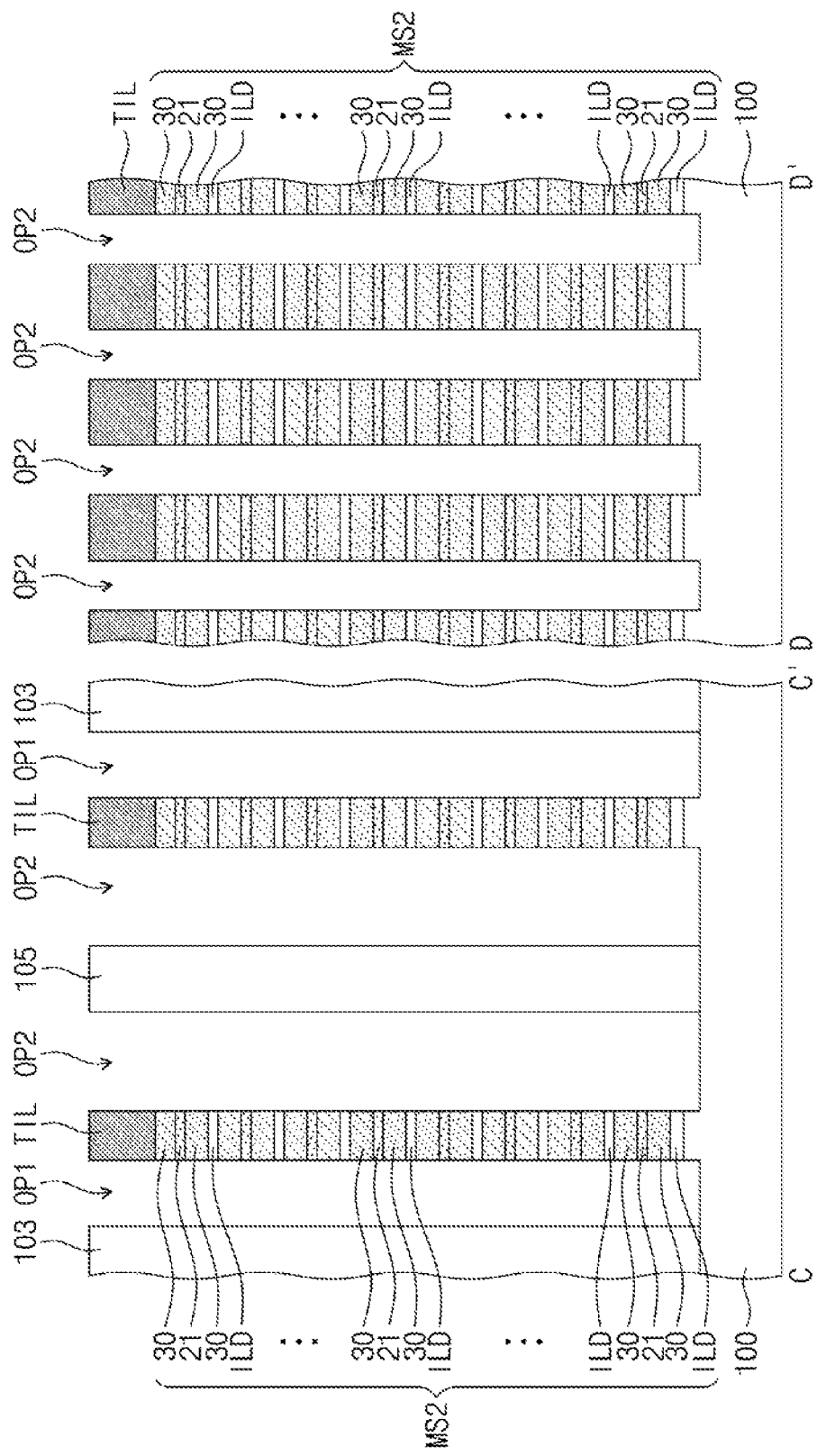
Figure 8D:
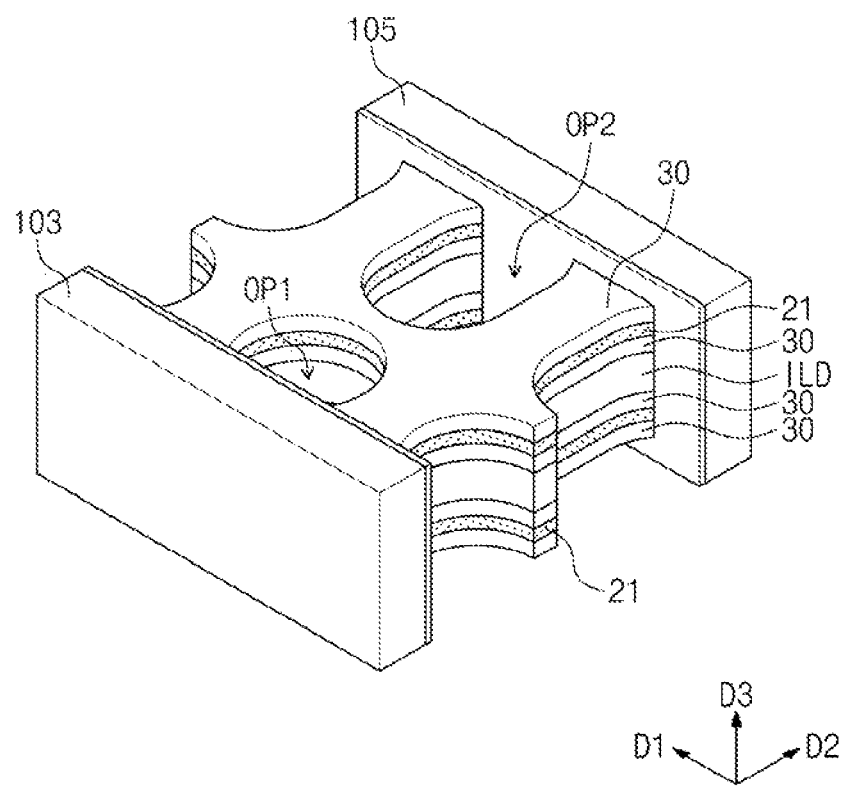
Figure 9A:
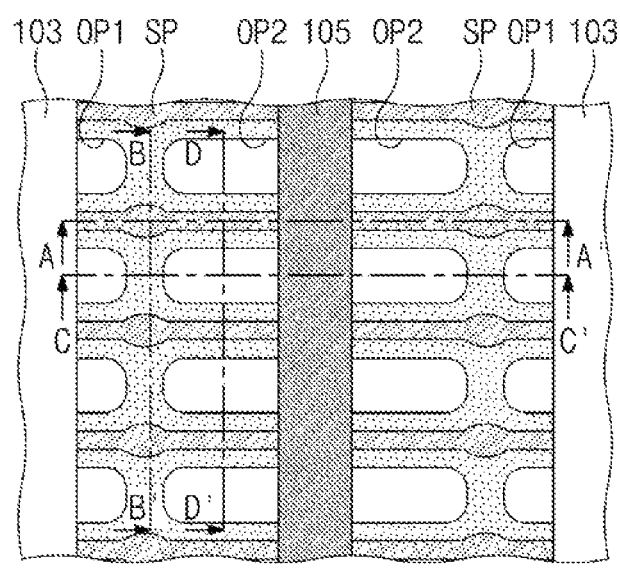
Figure 9A:
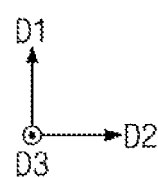
Figure 9B:
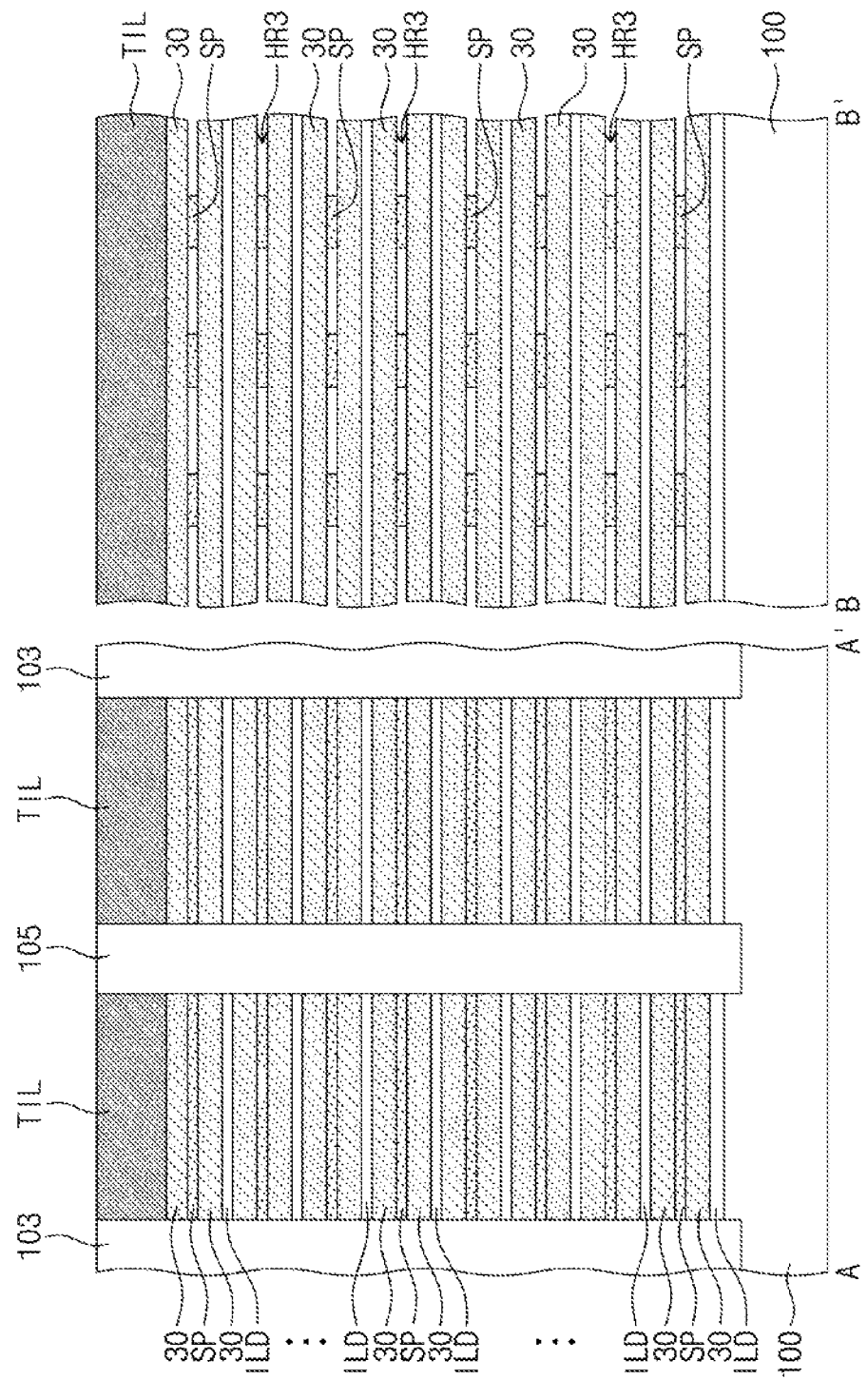
Figure 9C:
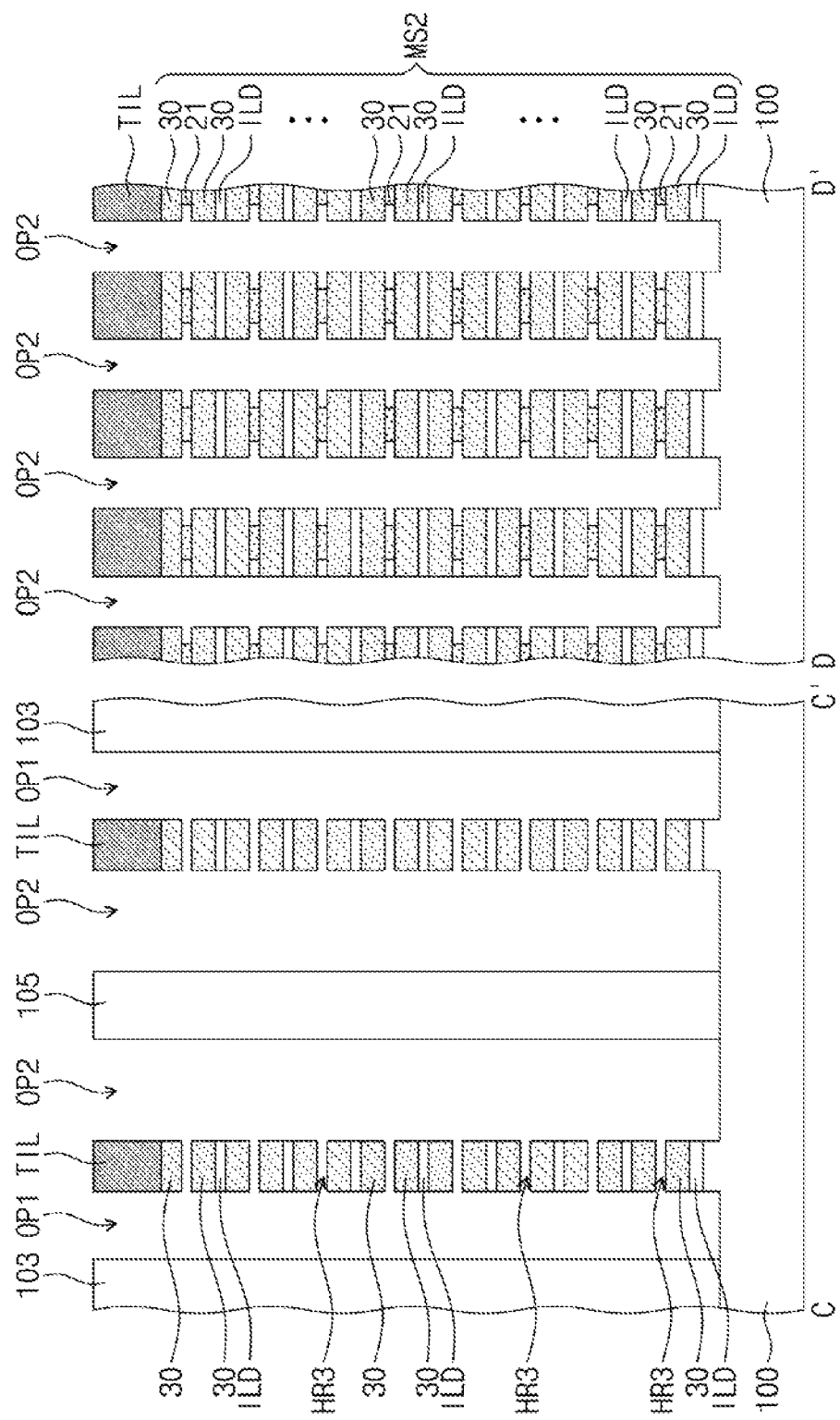
Figure 9D:
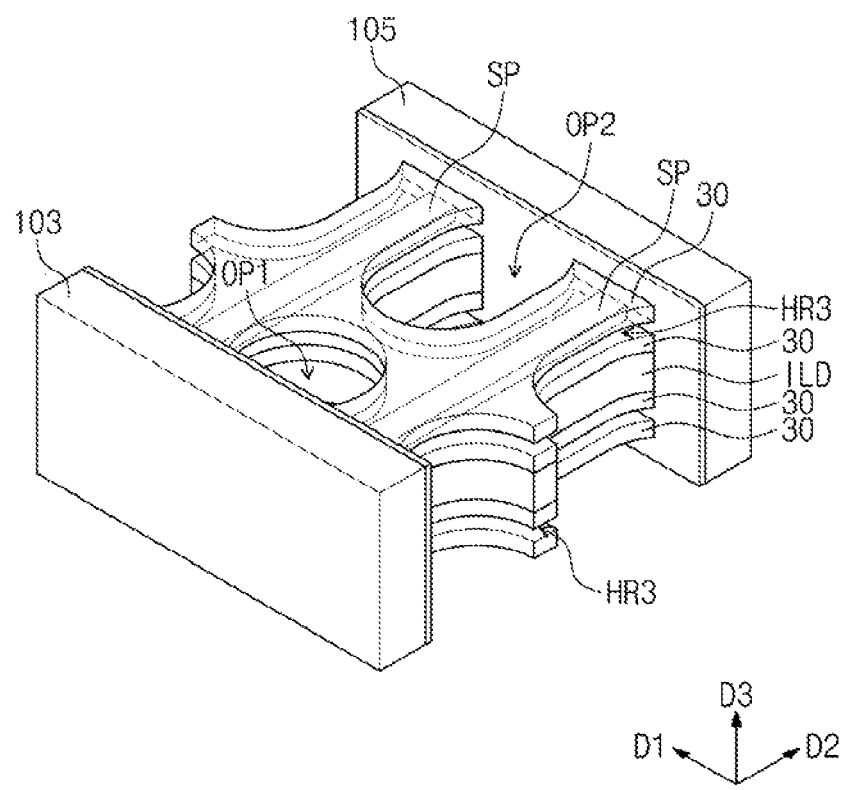
Figure 10A:
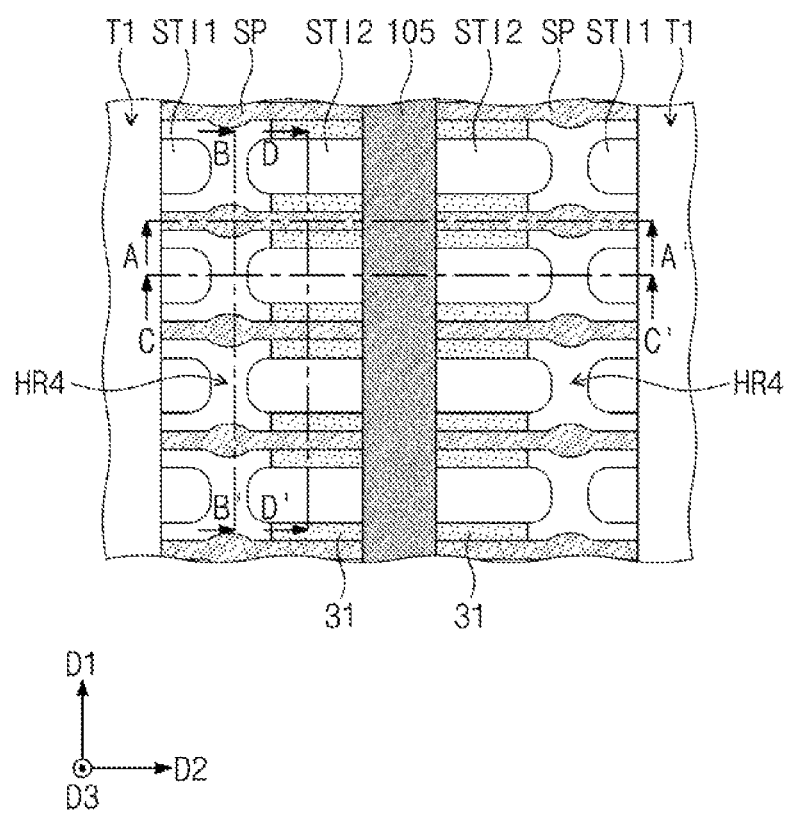
Figure 10B:
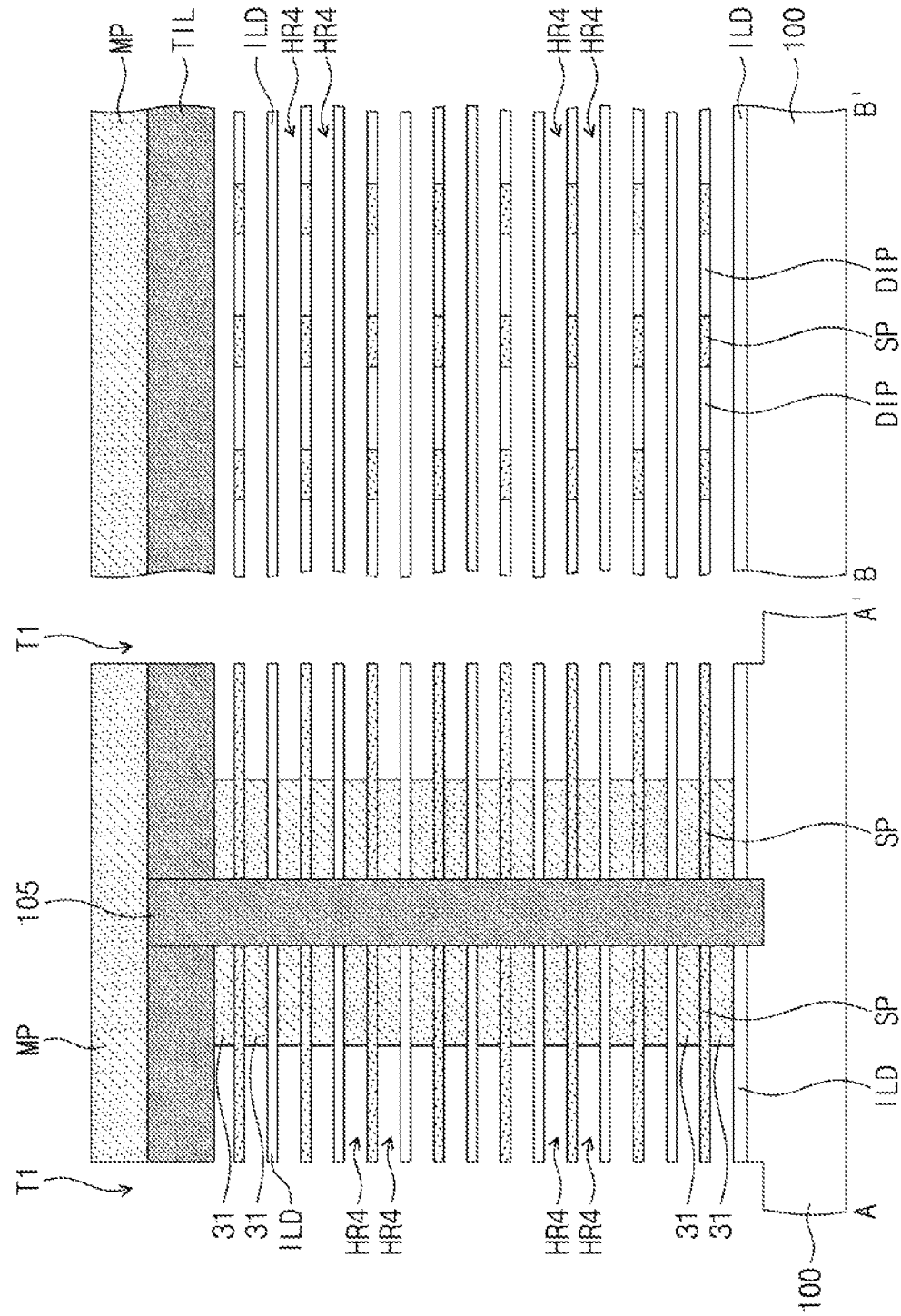
Figure 10C:
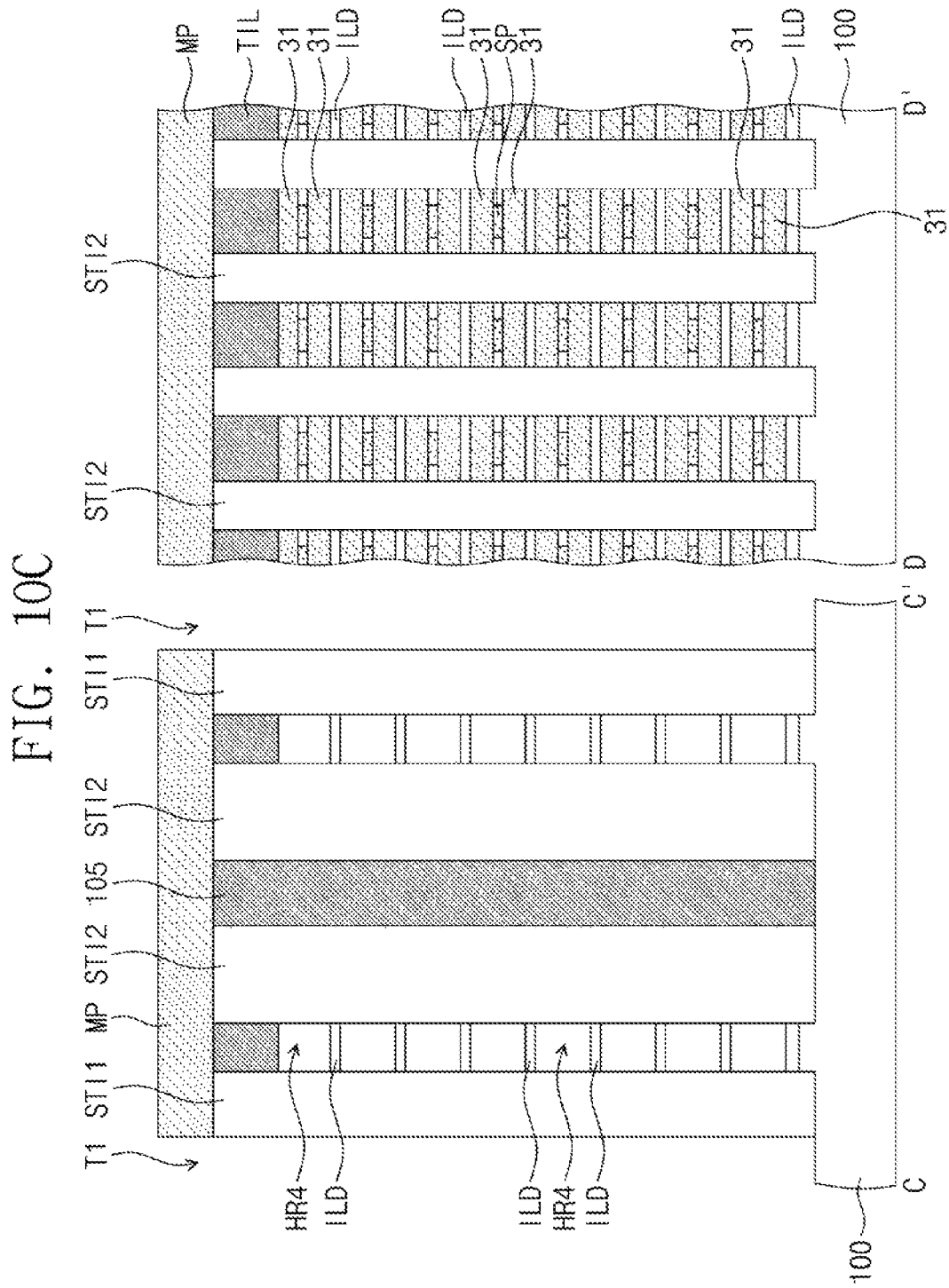
Figure 10D:
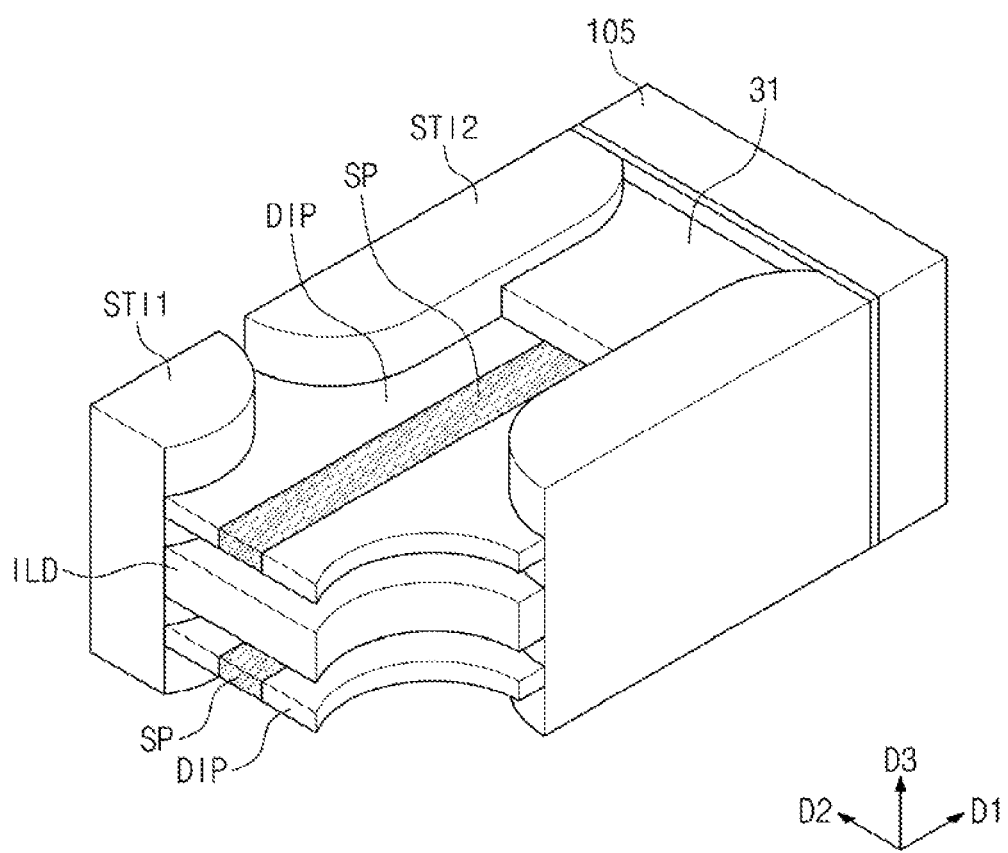
Figure 11A:
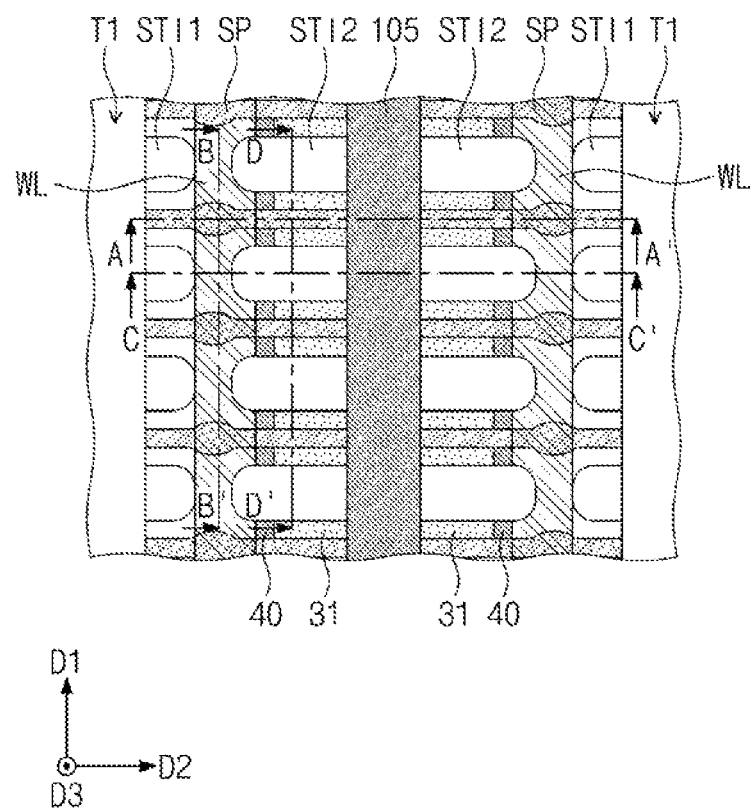
Figure 11B:
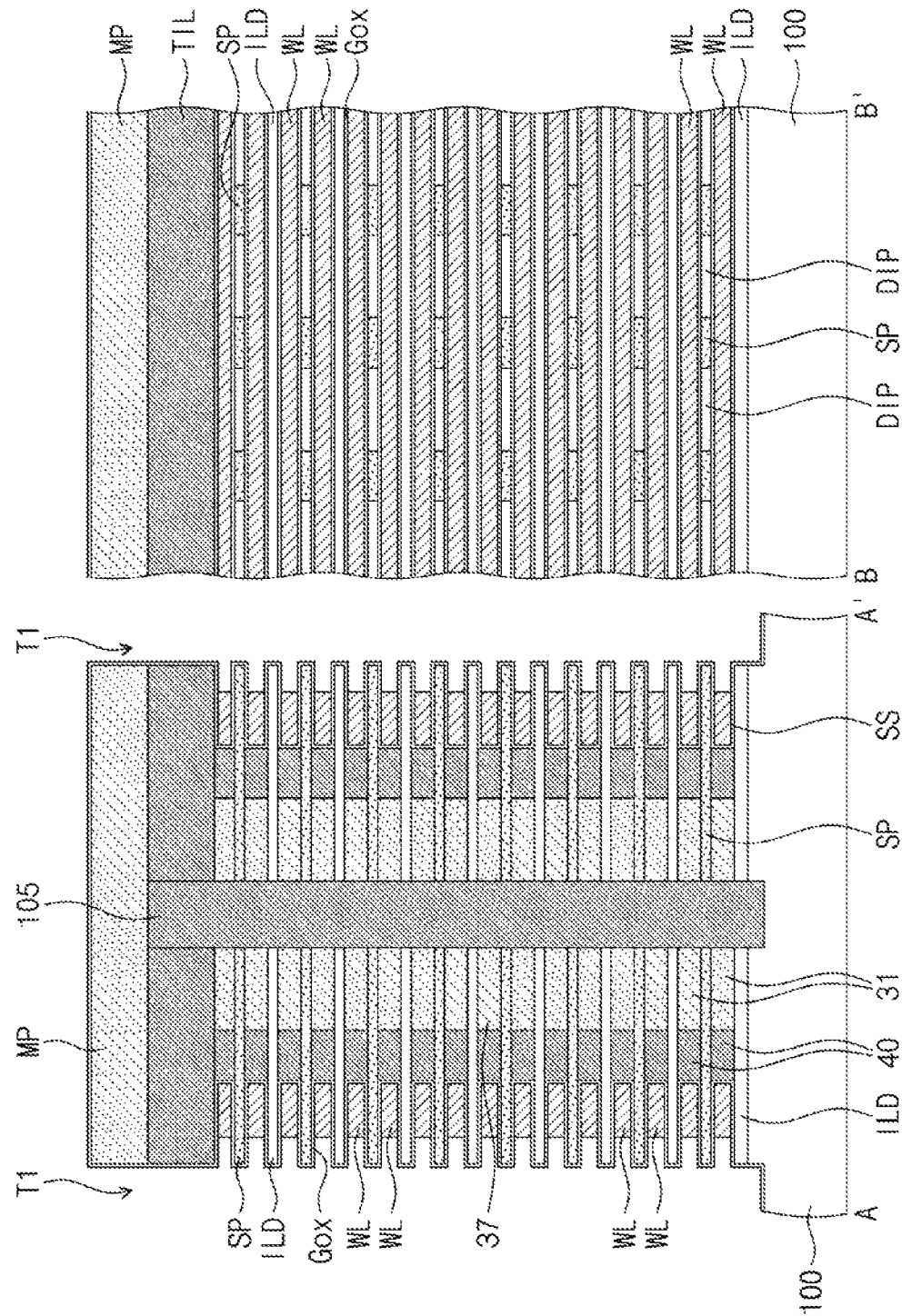
Figure 11C:
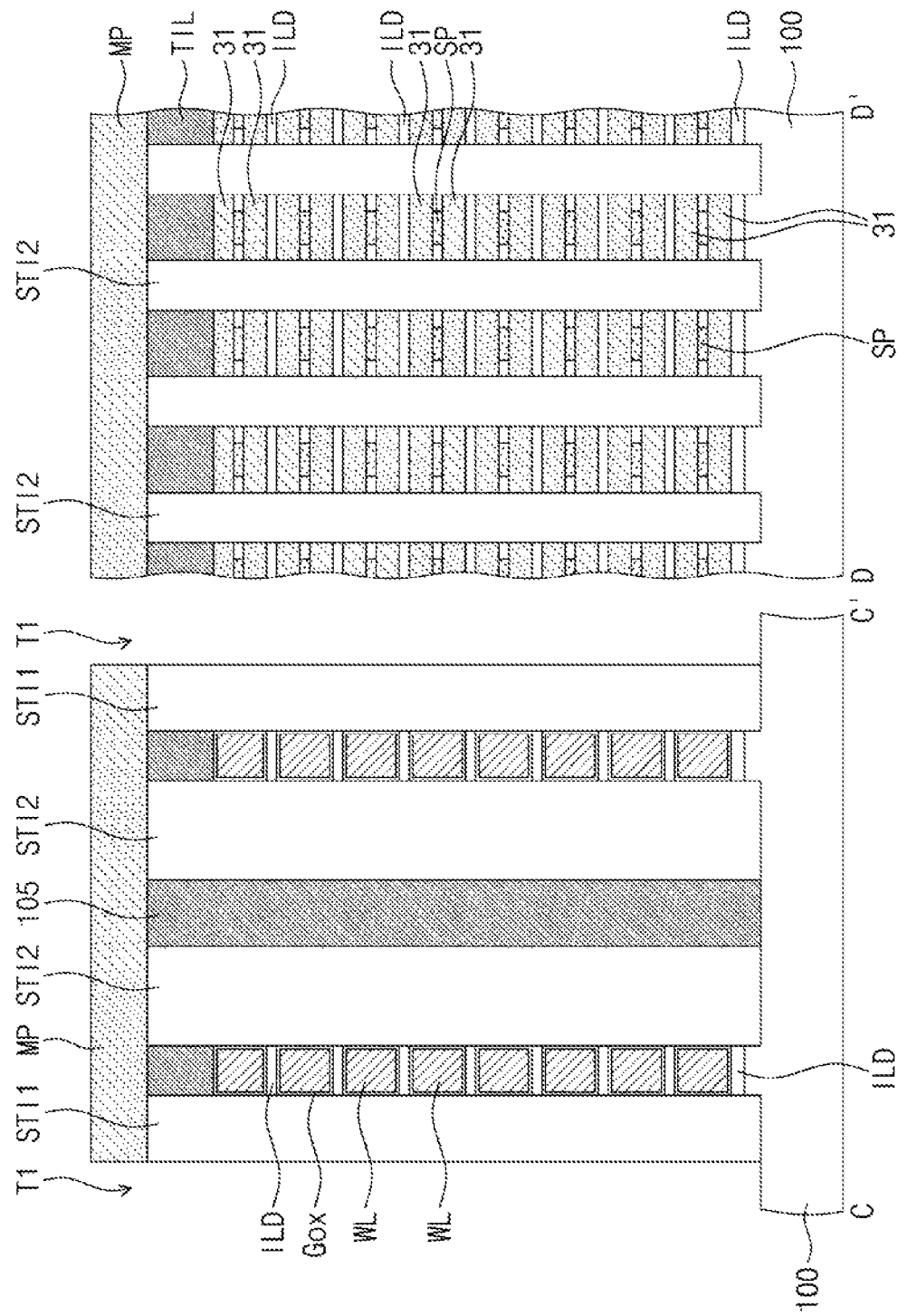
Figure 11D:
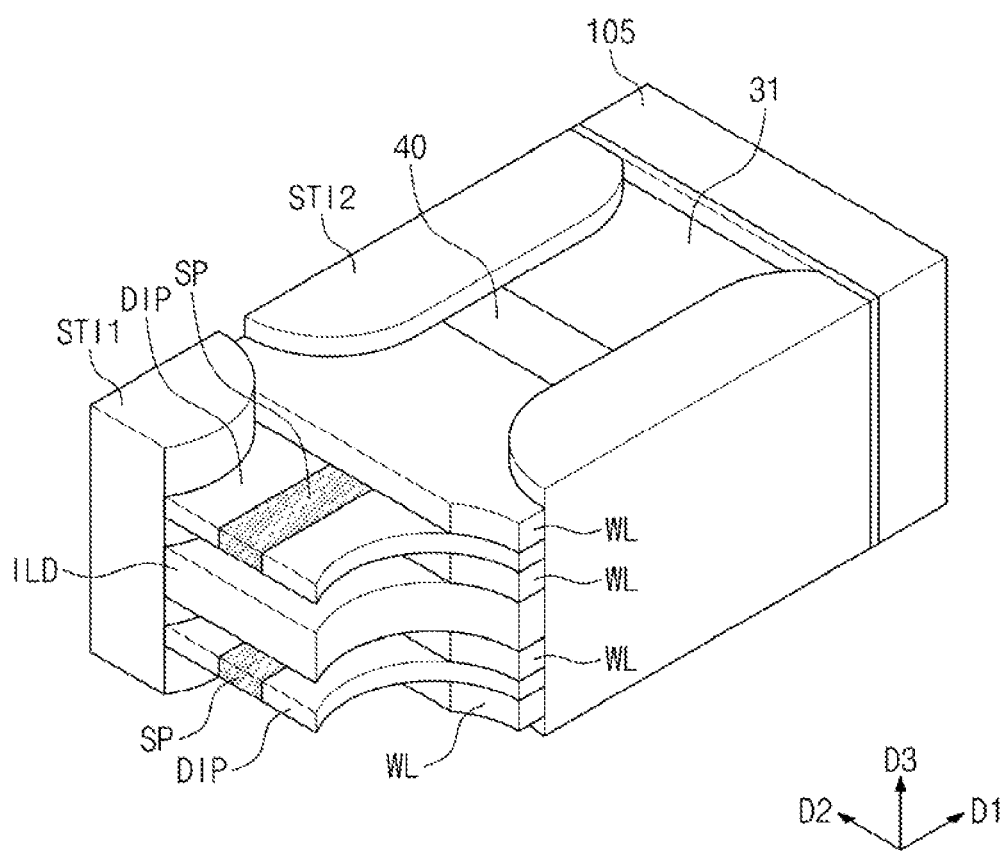
Figure 12A:
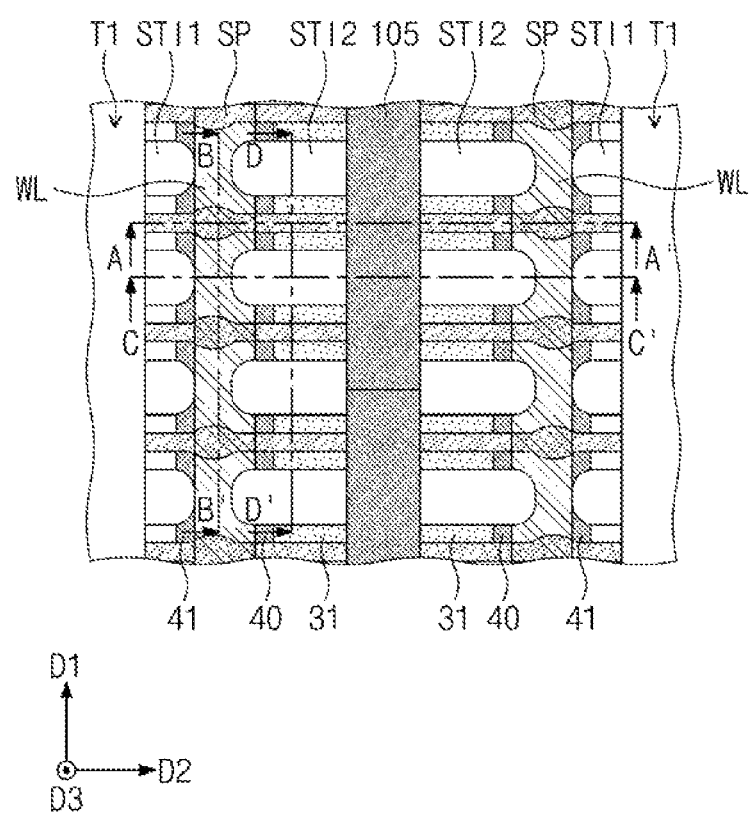
Figure 12B:
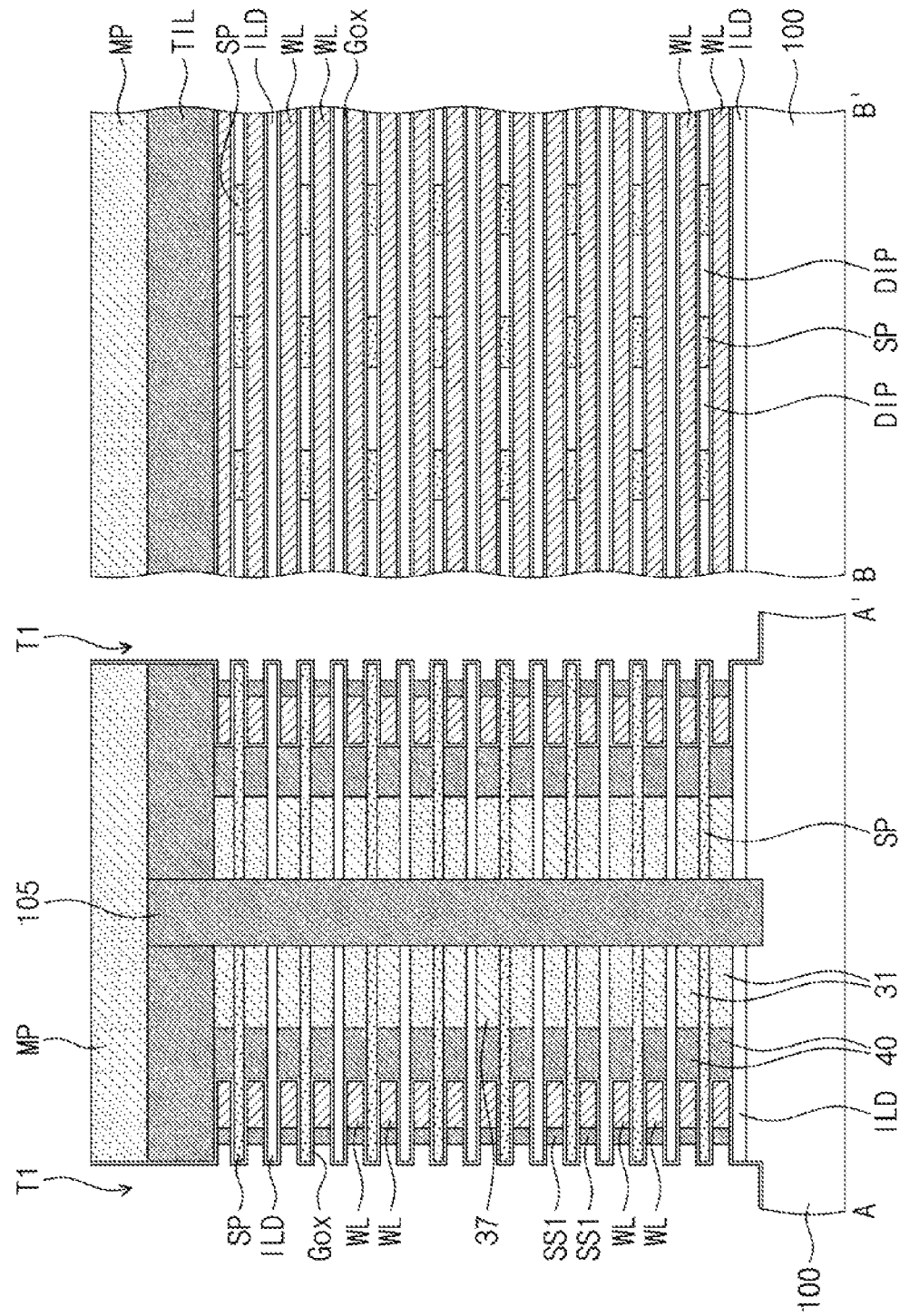
Figure 12C:
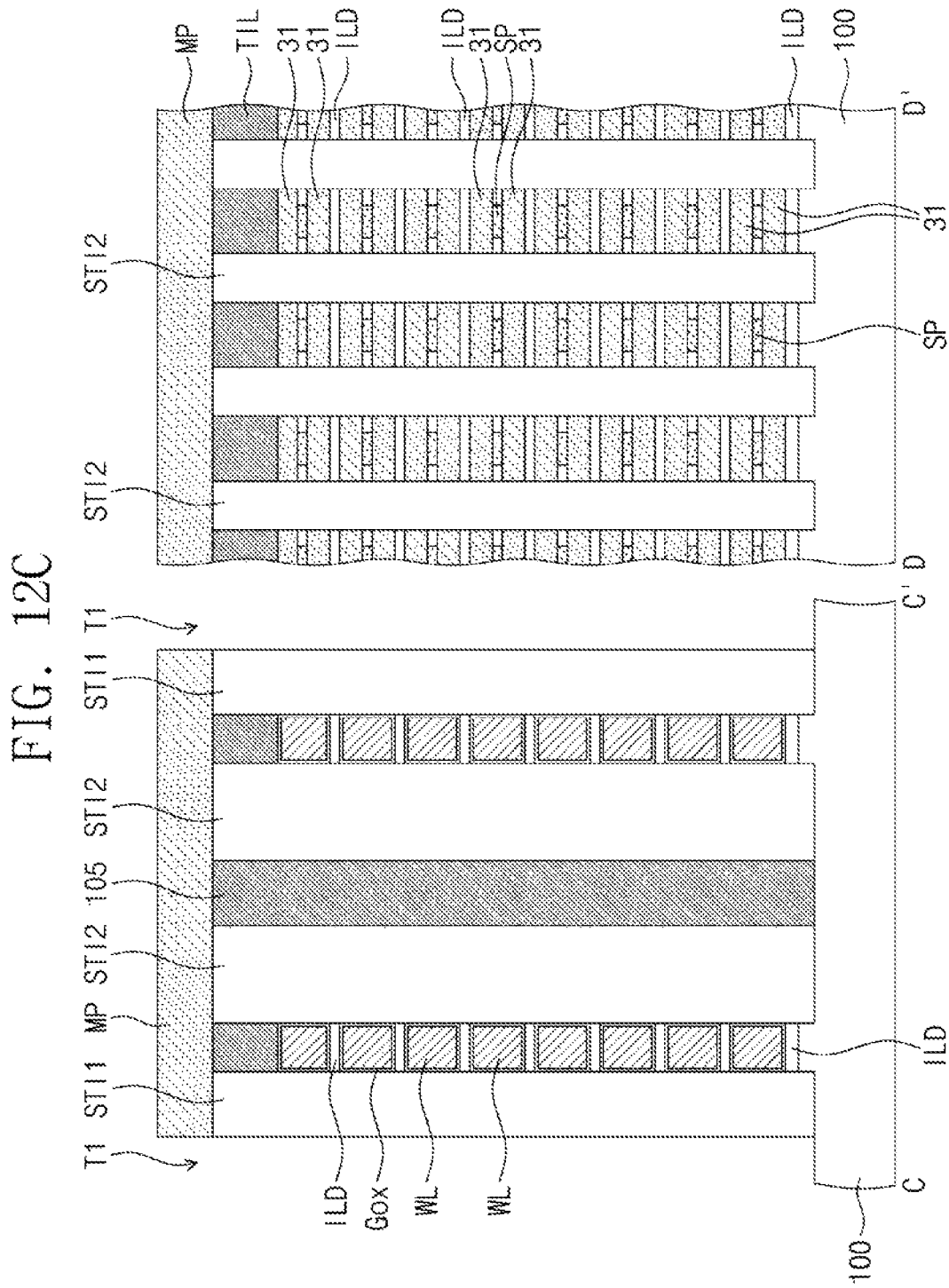
Figure 12D:
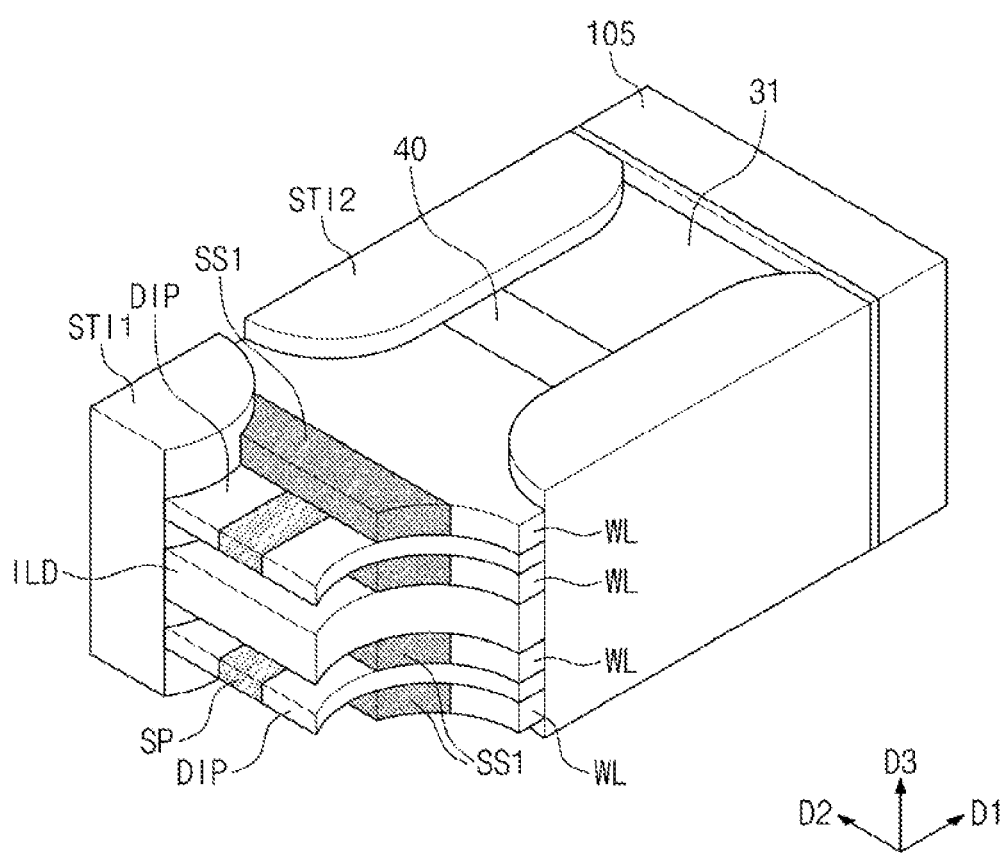

FIG. 2A is a plan view illustrating a semiconductor memory device according to an example embodiment. FIG. 2B is a sectional view taken along lines A-A' and B-B' of FIG. 2A. FIG. 2C is a sectional view taken along lines C-C' and D-D' of FIG. 2A. FIGS. 3A and 3B are enlarged sectional views illustrating a portion 'P' of FIG. 2B. FIG. 4 is a perspective view illustrating a portion of a semiconductor memory device according to an example embodiment.

Referring to FIGS. 2A, 2B, and 2C, a semiconductor memory device may include first and second stacks, which are disposed on a semiconductor substrate 100.

The semiconductor substrate 100 may be formed of or include at least one of a semiconductor material (e.g., silicon), an insulating material (e.g., glass), or a semiconductor or conductive material covered with an insulating material.

The first stack may be extended in a first direction D1 and may include the first word lines WLa, which are disposed on the semiconductor substrate 100 with interlayer insulating patterns ILD interposed therebetween and are stacked in a third direction D3. The second stack may be spaced apart from the first stack in a second direction D2 and may be extended in the first direction D1. The second stack may include the second word lines WLb, which are disposed on the semiconductor substrate 100 with the interlayer insulating patterns ILD interposed between and are stacked in the third direction D3. Each of the first and second stacks may include an upper insulating layer TIL covering the uppermost ones of the first and second word lines WLa and WLb.

In an example embodiment, each of the first and second word lines WLa and WLb may have a double gate structure facing a top surface and a bottom surface of a channel pattern SP, as shown in FIG. 4. In another implementation, each of the first and second word lines WLa and WLb may have a structure completely enclosing the channel pattern SP (e.g., a gate-all-around structure).

Each of the first and second word lines WLa and WLb may include a line portion, which is extended in the first direction D1 parallel to a top surface of the semiconductor substrate 100, and gate electrode portions, which are extended from the line portion in the second direction D2, as shown in FIG. 4. Here, the line portion may be disposed between first and second insulating isolation patterns STI1 and STI2. In addition, when measured in the second direction D2, a width of the gate electrode portion may be larger than a width of the line portion. When viewed in a plan view, a pair of the first and second word lines WLa and WLb may be disposed to have a mirror symmetry about a plate electrode PE.

The first and second word lines WLa and WLb may be formed of or include at least one of doped semiconductor materials (e.g., doped silicon, doped germanium, and so forth), conductive metal nitrides (e.g., titanium nitride, tantalum nitride, and so forth), metallic materials (e.g., tungsten, titanium, tantalum, and so forth), or metal-semiconductor compounds (e.g., tungsten silicide, cobalt silicide, titanium silicide, and so forth).

The channel patterns SP may be stacked in the third direction D3, and may be spaced apart from each other in the first and second directions D1 and D2. Thus, the channel patterns SP may be three-dimensionally arranged on the semiconductor substrate 100. Referring to FIG. 4, each of the channel patterns SP may be provided to cross the first or the second word lines WLa or WLb, and may be a bar-shaped pattern having a long axis parallel to the second direction D2. In the case where the first and second word lines WLa and WLb have a double gate structure, dummy insulating patterns DIP may be disposed between the channel patterns SP, which are arranged in the first direction D1, and between a pair of gates.

The channel patterns SP may be formed of or include at least one of silicon (Si), germanium (Ge), or silicon germanium (SiGe). As an example, the channel patterns SP may be formed of or include single crystalline silicon. In an example embodiment, the channel patterns SP may have a band gap energy that is greater than that of silicon. For example, the channel patterns SP may have a band gap energy of about 1.5 eV to 5.6 eV. For example, when the channel patterns SP have a band gap energy of about 2.0 eV to 4.0 eV, the channel patterns SP may have an optimized channel performance. As an example, the channel patterns SP may be formed of or include at least one of oxide semiconductor materials (e.g., $Zn_xSn_yO$ (ZTO), $In_xZn_yO$ (IZO), $Zn_xO$, $In_xGa_yZn_zO$ (IGZO), $In_xGa_y, Si_zO$ (IGSO), $In_xW_yO$ (IWO), $In_xO$, $Sn_xO$, $Ti_xO$, $Zn_xON_z$, $Mg_xZn_yO$, $Zr_xIn_yZn_zO$, $Hf_x$-$In_yZn_zO$, $Sn_xIn_yZn_zO$, $Al_xSn_yIn_zZn_aO$, $Si_xIn_yZn_zO$, $Al_xZn_zSn_zO$, $Ga_xZn_ySn_zO$, $Zr_xZn_ySn_zO$, or combinations thereof).

First and second bit lines BLa and BLb may be extended in the third direction D3 that is perpendicular to the top surface of the semiconductor substrate 100. The first and second bit lines BLa and BLb may be provided to cross the first and second word lines WLa and WLb. The first bit lines BLa may be spaced apart from each other in the first direction D1, and the first insulating isolation patterns STI1 may be respectively disposed between the first bit lines BLa, which are adjacent to each other in the first direction D1. The first insulating isolation patterns STI1 may be extended in the third direction D3. The first insulating isolation patterns STI1 may be formed of or include at least one of silicon oxide, silicon oxynitride, or insulating materials, which are formed using a spin-on-glass (SOG) technology.

The second bit lines BLb may be spaced apart from the first bit lines BLa in the second direction D2, and may be spaced apart from each other in the first direction D1. The first insulating isolation patterns STI1 may be respectively disposed between the second bit lines BLb, which are adjacent to each other in the first direction D1.

Each of the first and second bit lines BLa and BLb may be in contact with first side surfaces of the channel patterns SP, which are spaced apart from each other in the third direction D3. Thus, each of the first and second bit lines BLa and BLb may be connected to first dopant regions of the channel patterns SP, which are stacked in the third direction D3.

The data storage element DS may be in contact with a second side surface of each channel pattern SP. In an example embodiment, the data storage element DS may be a capacitor, and the data storage element DS may include a storage electrode SE, the plate electrode PE, and a capacitor dielectric layer CIL therebetween.

The storage electrode SE may be in contact with the second side surface of each channel pattern SP. The storage electrodes SE may be located at substantially the same level as the channel patterns SP. Thus, the storage electrodes SE may be stacked in the third direction D3 and may have a long axis parallel to the second direction D2. The storage electrodes SE may be respectively disposed between vertically adjacent ones of the interlayer insulating patterns ILD.

The capacitor dielectric layer CIL may be provided to conformally cover the storage electrodes SE. The plate electrode PE may be provided to fill inner spaces of the storage electrodes SE covered with the capacitor dielectric layer CIL.

The second insulating isolation patterns STI2 may be respectively disposed between the storage electrodes SE, which are adjacent to each other in the first direction D1. The second insulating isolation patterns STI2 may be extended in the third direction D3. The second insulating isolation patterns STI2 may be formed of or include at least one of silicon oxide, silicon oxynitride, or insulating materials, which are formed using a spin-on-glass (SOG) technology.

First spacer insulating patterns SS1 may be respectively disposed between the word lines WL and the bit lines BL, and between vertically adjacent ones of the interlayer insulating patterns ILD. The first spacer insulating pattern SS1 may be provided to enclose a first dopant region SD1 of the channel pattern SP.

Second spacer insulating patterns SS2 may be respectively disposed between the word lines WL and the data storage elements DS, and between vertically adjacent ones of the interlayer insulating patterns ILD. The second spacer insulating pattern SS2 may be provided to enclose a second dopant region SD2 of the channel pattern SP. When measured in the second direction D2, a width of the second spacer insulating patterns SS2 may be larger than a width of the first spacer insulating patterns SS1.

Insulating gapfill patterns 110 may be provided on the semiconductor substrate 100, and may be extended in the first direction D1. The insulating gapfill patterns 110 may cover side surfaces of the first and second bit lines BLa and BLb, and side surfaces of the first insulating isolation patterns STI1. The insulating gapfill patterns 110 may be formed of or include at least one of silicon oxide, silicon oxynitride, or insulating materials, which are formed using a spin-on-glass (SOG) technology.

Referring to FIGS. 3A and 3B, each of the channel patterns SP may include the first and second dopant regions SD1 and SD2, which are spaced apart from each other, and a channel region CH between the first and second dopant regions SD1 and SD2. The first and second dopant regions SD1 and SD2 of each channel pattern SP may contain dopants (e.g., phosphorus or boron) of a first conductivity type.

When measured in the second direction D2, a length of the first dopant region SD1 may be smaller than a length of the second dopant region SD2. The channel region CH may be overlapped with the word line WLa. When measured in the second direction D2, a length of the channel region CH may be smaller than or substantially equal to a width of the word line WLa.

Referring to FIG. 3A, the first dopant region SD1 may include a first low concentration region LDR1 and a first high concentration region HDR1. A concentration of dopants of the first conductivity type may be higher in the first high concentration region HDR1 than in the first low concentration region LDR1. The first high concentration region HDR1 may be in direct contact with the bit line BLa, thereby forming an ohmic contact. When measured in the second direction D2, a length of the first low concentration region LDR1 may be larger than a length of the first high concentration region HDR1. Due to the diffusion of the dopants in the first dopant region SD1, the first low concentration region LDR1 may be overlapped with a portion of the word line WLa.

The second dopant region SD2 may include a second low concentration region LDR2 and a second high concentration region HDR2. A concentration of the dopants of the first conductivity type may be higher in the second high concentration region HDR2 than in the second low concentration region LDR2. The second high concentration region HDR2 may be in direct contact with the storage electrode SE, thereby forming an ohmic contact. When measured in the second direction D2, a length of the second low concentration region LDR2 may be larger than a length of the second high concentration region HDR2. The second low concentration region LDR2 may be overlapped with a portion of the word line WLa, like the first low concentration region LDR1.

Meanwhile, according to the embodiment of FIG. 3B, the first dopant region SD1 may be provided to have a nonvanishing gradient of dopant concentration. The smaller the distance to the bit line BLa, the higher the dopant concentration in the first dopant region SD1. In addition, the dopant concentration in the first dopant region SD1 may be higher than that in the second low concentration region LDR2, and may be lower than that in the second high concentration region HDR2.

As another example, the first dopant region SD1 may include first low-concentration and high-concentration regions, and the second dopant region SD2 may be provided to have a nonvanishing gradient of dopant concentration. The smaller the distance to the storage electrode SE, the higher the dopant concentration in the second dopant region SD2.

A gate insulating layer Gox may be interposed between the channel patterns SP and the word lines WL. The gate insulating layer Gox may be provided to cover top, bottom, and side surfaces of each of the word lines WL with a uniform thickness. The gate insulating layers Gox may include at least one of a high-k dielectric layer, a silicon oxide layer, a silicon nitride layer, a silicon oxynitride layer, or combinations thereof and may have a single- or multi-layered structure. Here, the high-k dielectric layer may be formed of or include at least one of, for example, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

FIGS. 5A to 13A are plan views illustrating a method of fabricating a semiconductor memory device according to an example embodiment. FIGS. 5B to 13B are sectional views taken along lines A-A' and B-B' of FIGS. 2A to 13A, respectively. FIGS. 5C to 13C are sectional views taken along lines C-C' and D-D' of FIGS. 2A to 13A, respectively. FIGS. 5D to 13D are perspective views illustrating a method of fabricating a semiconductor memory device according to an example embodiment.

Referring to FIGS. 5A, 5B, 5C, and 5D, a first mold structure MS1 including first semiconductor layers 10 and second semiconductor layers 20, which are alternately stacked on the semiconductor substrate 100, may be formed.

The first semiconductor layers 10 may be formed of or include a material having an etch selectivity with respect to the second semiconductor layers 20. For example, the first semiconductor layers 10 may be formed of or include at least one of silicon germanium, silicon oxide, silicon nitride, or silicon oxynitride. In an example embodiment, the first semiconductor layers 10 may be formed of or include a semiconductor material (e.g., silicon germanium). When the first mold structure MS1 is formed, a thickness of each first semiconductor layer 10 may be smaller than a thickness of each second semiconductor layer 20.

The second semiconductor layers 20 may be formed of or include at least one of, for example, silicon, germanium, silicon-germanium, or indium gallium zinc oxide (IGZO). In an example embodiment, the second semiconductor layers 20 may be formed of or include the same semiconductor material as the semiconductor substrate 100. For example, the second semiconductor layers 20 may be a single crystalline silicon layer or a polysilicon layer.

In an example embodiment, the first and second semiconductor layers 10 and 20 may be formed by performing an epitaxial growth process. The second semiconductor layers 20 may be single crystalline silicon layers, and sacrificial layers may be silicon germanium layers having a super lattice structure.

The upper insulating layer TIL may be formed on the first mold structure MS1 to cover the uppermost one of the second semiconductor layers 20. The upper insulating layer TIL may be formed of or include an insulating material having an etch selectivity with respect to the first and second semiconductor layers 10 and 20. For example, the upper insulating layer TIL may be a silicon oxide layer.

First sacrificial line patterns 103 and a second sacrificial line pattern 105 may be formed to penetrate the first mold structure MS1 and to extend in the first direction D1. The second sacrificial line pattern 105 may be formed between a pair of the first sacrificial line patterns 103. The first and second sacrificial line patterns 103 and 105 may cover side surfaces of the first and second semiconductor layers 10 and 20.

The formation of the first and second sacrificial line patterns 103 and 105 may include patterning the first mold structure MS1 to form trenches exposing the side surfaces of the first and second semiconductor layers 10 and 20, forming an insulating gapfill layer filling the trenches, and planarizing the insulating gapfill layer to expose a top surface of the upper insulating layer TIL. The planarization of the insulating gapfill layer may be performed using a planarization technology (e.g., a chemical-mechanical polishing technology or an etch-back technology).

The first and second sacrificial line patterns 103 and 105 may be formed of or include at least one of, for example, silicon oxide, silicon nitride, or silicon oxynitride. The first and second sacrificial line patterns 103 and 105 may have a single- or multi-layered structure.

Next, the upper insulating layer TIL and the first mold structure MS1 may be patterned to form first and second openings OP1 and OP2 exposing the semiconductor substrate 100.

The formation of the first and second openings OP1 and OP2 may include forming a mask pattern (not shown), which has openings corresponding to the first and second openings OP1 and OP2, on the first mold structure MS1, and anisotropically etching the first mold structure MS1 using the mask pattern as an etch mask.

The first and second openings OP1 and OP2 may be formed to expose the top surface of the semiconductor substrate 100. In the case where the anisotropic etching process is performed in an over-etch manner, the top surface of the semiconductor substrate 100, which is exposed to the first and second openings OP1 and OP2, may be recessed.

The first and second openings OP1 and OP2 may be respectively formed between the first and second sacrificial line patterns 103 and 105, which are adjacent to each other. The first openings OP1 may be formed to be spaced apart from each other in the first direction D1. The second openings OP2 may be spaced apart from each other in the first direction D1. The second openings OP2 may be spaced apart from the first openings OP1 in the second direction D2. The first openings OP1 may be adjacent to the first sacrificial line patterns 103. The second openings OP2 may be adjacent to the second sacrificial line pattern 105.

When measured in the first direction D1, the first and second openings OP1 and OP2 may have the same width. When measured in the second direction D2, the first openings OP1 may have a first length, and the second openings OP2 may have a second length larger than the first length.

When measured in the first direction D1, the first and second openings OP1 and OP2 may be spaced apart from each other by a first distance. When measured in the second direction D2, the first openings OP1 may be spaced apart from the second openings OP2 by a second distance smaller than the first distance.

Referring to FIGS. 6A, 6B, 6C, and 6D, the first semiconductor layers 10, which are exposed to the first and second openings OP1 and OP2, may be removed to form first horizontal regions HR1 between vertically adjacent ones of the second semiconductor layers 20.

The formation of the first horizontal regions HR1 may include isotropically etching the first semiconductor layers 10 by performing an etching process having an etch selectivity with respect to the semiconductor substrate 100, the second semiconductor layers 20, and the first and second sacrificial line patterns 103 and 105. The second semiconductor layers 20 may not be collapsed by the first and second sacrificial line patterns 103 and 105, when the first semiconductor layers 10 are removed, and thus, the second semiconductor layers 20 may be vertically spaced apart from each other after the formation of the first horizontal regions HR1.

A vertical thickness of the first horizontal regions HR1 (i.e., a vertical distance between adjacent ones of the second semiconductor layers 20) may be substantially equal to the thickness of the first semiconductor layer 10.

Referring to FIGS. 7A, 7B, 7C, and 7D, a trimming process may be performed to reduce a thickness of the second semiconductor layers 20 exposed to the first horizontal regions HR1. The trimming process may include etching top and bottom surfaces of the second semiconductor layers 20 exposed to the first horizontal regions HR1. As an example, the trimming process may include performing an isotropic etching process, which is chosen to have an etch selectivity with respect to the upper insulating layer TIL and the first and second sacrificial line patterns 103 and 105.

As a result of the trimming process, a thickness of each of the second semiconductor layers 20 may be reduced to form preliminary channel layers 21. Furthermore, a vertical thickness of the first horizontal regions HR1 may be increased, and in this case, second horizontal regions HR2 may be respectively formed between vertically adjacent ones of the preliminary channel layers 21.

Referring to FIGS. 8A, 8B, 8C, and 8D, a sacrificial layer and an interlayer insulating layer may be sequentially deposited on surfaces of the preliminary channel layers 21, and a partial etching process on the interlayer insulating layer and the sacrificial layer may be performed to form a second mold structure MS2 on the semiconductor substrate 100. The second mold structure MS2 may include the preliminary channel layers 21, sacrificial patterns 30, which are provided between vertically adjacent ones of the preliminary channel layers 21, and the interlayer insulating patterns ILD, which are provided between vertically adjacent ones of the sacrificial patterns 30.

In more detail, when the second mold structure MS2 is formed, the sacrificial layer may be deposited to have a thickness that is smaller than half of the vertical thickness of the second horizontal region HR2. In this case, after the deposition of the sacrificial layer, gap regions may be defined between vertically adjacent ones of the preliminary channel layers 21. Next, the interlayer insulating layer may be formed on the sacrificial layer to fill the second horizontal regions HR2 provided with the sacrificial layer.

After the formation of the interlayer insulating layer, the interlayer insulating patterns ILD may be formed by etching portions of the interlayer insulating layer exposed to the first and second openings OP1 and OP2. The interlayer insulating patterns ILD may be formed by isotropically etching the interlayer insulating layer until the sacrificial layer is exposed to the first and second openings OP1 and OP2. The interlayer insulating patterns ILD may be vertically separated from each other by the isotropic etching process.

Next, the sacrificial patterns 30, which are vertically spaced apart from each other, may be formed by performing an isotropic etching process on the sacrificial layer through the first and second openings OP1 and OP2. The isotropic etching process on the sacrificial layer may be performed until side surfaces of the preliminary channel layers 21 are exposed to the first and second openings OP1 and OP2. Thus, after the formation of the second mold structure MS2, the side surfaces of the preliminary channel layers 21, the side surfaces of the sacrificial patterns 30, and the side surfaces of the interlayer insulating patterns ILD may be exposed to the first and second openings OP1 and OP2.

The sacrificial patterns 30 may be formed by depositing a material having an etch selectivity with respect to the semiconductor substrate 100 and the preliminary channel layers 21. For example, the sacrificial patterns 30 may be formed of or include at least one of silicon oxide, silicon nitride, or silicon oxynitride.

The interlayer insulating patterns ILD may be formed of or include an insulating material having an etch selectivity with respect to the sacrificial patterns 30 and the semiconductor substrate 100. As an example, the interlayer insulating patterns ILD may be formed of or include silicon oxide.

Referring to FIGS. 9A, 9B, 9C, and 9D, an etching process may be performed on portions of the preliminary channel layers 21 exposed to the first and second openings OP1 and OP2. Accordingly, the channel patterns SP, which are spaced apart from each other in the first direction D1, may be formed.

The formation of the channel patterns SP may include isotropically etching the preliminary channel layers 21, which are exposed to the first and second openings OP1 and OP2. For example, an etchant material may be supplied through the first and second openings OP1 and OP2 to etch the preliminary channel layers 21 in a lateral direction (e.g., the first and second directions D1 and D2). In this case, since a distance between the first openings OP1 and a distance between the second openings OP2 are larger than a distance between the first and second openings OP1 and OP2, portions of the preliminary channel layers 21 may be separated from each other in the first direction D1 to form the channel patterns SP. As a result of the isotropic etching process, a width of each of the channel patterns SP in the first direction D1 may be larger in its center portion than in its edge portion. In another implementation, each of the channel patterns SP may have a uniform width in the first direction D1.

In the case where the channel patterns SP are formed by the afore-described method, third horizontal regions HR3, which expose side surfaces of the channel patterns SP, may be formed between the sacrificial patterns 30. The third horizontal regions HR3 may correspond to empty regions, which are formed by etching the preliminary channel layers 21.

Referring to FIGS. 10A, 10B, 10C, and 10D, after the formation of the channel patterns SP, the first and second insulating isolation patterns STI1 and STI2 may be formed to fill the first and second openings OP1 and OP2, respectively.

The first and second insulating isolation patterns STI1 and STI2 may be in contact with the semiconductor substrate 100. The first and second insulating isolation patterns STI1 and STI2 may be formed of or include at least one of silicon oxide, silicon oxynitride, or insulating materials, which are formed using a spin-on-glass (SOG) technology. The first and second insulating isolation patterns STI1 and STI2 may be formed by depositing an insulating isolation layer to fill the first and second openings OP1 and OP2 and planarizing the insulating isolation layer to expose a top surface of the upper insulating layer TL.

During the formation of the first and second insulating isolation patterns STI1 and STI2, the third horizontal regions HR3 may be filled with an insulating material. Accordingly, the dummy insulating patterns DIP may be formed between the channel patterns SP, which are adjacent to each other in the first direction D1.

Next, a mask pattern MP may be formed on the upper insulating layer TIL to expose the first sacrificial line patterns 103.

Thereafter, first trenches T1 exposing the semiconductor substrate 100 may be formed by etching the first sacrificial line patterns 103 using the mask pattern MP as an etch mask. Here, the first trenches T1 may be formed to expose the side surfaces of the channel patterns SP, the side surfaces of the sacrificial patterns 30, and the side surfaces of the interlayer insulating patterns ILD.

Next, fourth horizontal regions HR4 may be respectively formed between the channel patterns SP and the interlayer insulating patterns ILD by isotropically etching portions of the sacrificial patterns 30, which are exposed to the first trenches T1.

The fourth horizontal regions HR4 may be formed by isotropically etching the sacrificial patterns 30 using an etch recipe having an etch selectivity with respect to the channel patterns SP and the interlayer insulating patterns ILD. As an example, in the case where the sacrificial patterns 30 and the interlayer insulating patterns ILD are formed of silicon nitride and silicon oxide, respectively, the isotropic etching of the sacrificial patterns 30 to form the fourth horizontal regions HR4 may be performed using an etching solution containing phosphoric acid. The fourth horizontal regions HR4 may be extended in the first direction D1, between the first and second insulating isolation patterns STI1 and STI2.

As a result of the formation of the fourth horizontal regions HR4, the sacrificial patterns 30 may be partially left to form first sacrificial patterns 31. The first sacrificial patterns 31 may be separated from each other in the first direction D1 by the second insulating isolation patterns STI2.

Referring to FIGS. 11A, 11B, 11C, and 11D, buffer patterns 40 may be formed to fill portions of the fourth horizontal regions HR4.

The buffer patterns 40 may be formed by depositing an insulating layer to fill the fourth horizontal regions HR4 and partially etching the insulating layer such that portions of the insulating layer are left in the fourth horizontal regions HR4. The buffer patterns 40 may be separated from each other in the first direction D1 by the second insulating isolation patterns STI2. The buffer patterns 40 may be formed of or include a material having an etch selectivity with respect to the first sacrificial patterns 31. For example, the buffer patterns 40 may be formed of or include silicon oxide.

Thereafter, the gate insulating layer Gox and the word lines WL may be sequentially formed in the fourth horizontal regions HR4 provided with the buffer patterns 40.

The formation of the gate insulating layer Gox and the word lines WL may include forming the gate insulating layer Gox to conformally cover the fourth horizontal regions HR4 provided with the buffer patterns 40, forming a gate conductive layer on the gate insulating layer Gox to fill the fourth horizontal regions HR4, and removing the gate conductive layer from the first trenches T1 to form the word lines WL, which are vertically separated from each other. Here, the word lines WL may be formed to have side surfaces, which are further recessed inward relative to the side surfaces of the channel patterns SP, and thereby to partially fill the fourth horizontal regions HR4. The word lines WL may be formed on top and bottom surfaces of center portions (i.e., channel portions) of the channel patterns SP, and may be extended in the first direction D1. Thus, each of the word lines WL may be provided to face the top and bottom surfaces of the channel pattern SP, or to have a double gate structure. In another implementation, the word lines WL may be provided to completely surround the center portions (i.e., the channel portions) of the channel patterns SP, or to have a gate-all-around structure.

In a region near the side surfaces of the second insulating isolation patterns STI2, the word lines WL may have substantially the same sidewall profile as the second insulating isolation patterns STI2. Thus, each of the word lines WL may have a non-uniform width, when measured in the second direction D2.

Referring to FIGS. 12A, 12B, 12C, and 12D, the first spacer insulating patterns SS1 may be formed in the fourth horizontal regions HR4 provided with the word lines WL. The first spacer insulating patterns SS1 may be formed to partially expose the channel patterns SP.

The formation of the first spacer insulating patterns SS1 may include forming a capping insulating layer on inner surfaces of the first trenches T1 to fill the fourth horizontal regions HR4, and removing the capping insulating layer from the first trenches T1 to expose the side surfaces of the interlayer insulating patterns ILD. The capping insulating layer may be etched by an isotropic etching process having an etch selectivity with respect to the interlayer insulating patterns ILD and the channel patterns SP. When the first spacer insulating patterns SS1 are formed, the gate insulating layer Gox on the side surfaces of the interlayer insulating patterns ILD may be partially etched.

Before or after the formation of the first spacer insulating patterns SS1, portions of the channel patterns SP, which are exposed to the first trenches T1, may be doped with impurities. Accordingly, the first dopant regions (e.g., see SD1 of FIGS. 3A and 3B) may be formed in the channel patterns SP. The first dopant regions may be formed by performing a gas phase doping (GPD) process or a plasma assisted doping (PLAD) process through the first trenches T1.

Referring to FIGS. 13A, 13B, 13C, and 13D, the bit lines BL may be formed in the first trenches T1, after the formation of the first spacer insulating patterns SS1.

The formation of the bit lines BL may include depositing a conductive layer on inner surfaces of the first trenches T1 to fill spaces between the first insulating isolation patterns STI1, and removing the conductive layer on the inner surfaces of the first trenches T1 to expose the side surfaces of the first insulating isolation patterns STI1.

The bit lines BL, which are formed by the afore-described method, may be extended in the third direction D3 perpendicular to the top surface of the semiconductor substrate 100, and may be spaced apart from each other in the first direction D1 by the first insulating isolation patterns STI1. Each of the bit lines BL may be in contact with the first dopant regions of the channel patterns SP. The bit lines BL may be formed of or include at least one of doped silicon, metallic materials, metal nitrides, or metal silicides. For example, the bit lines BL may be formed of or include tantalum nitride or tungsten. The mask pattern MP may be removed, after the formation of the bit lines BL.

After the formation of the bit lines BL, the insulating gapfill patterns 110 may be formed in the first trenches T1. The insulating gapfill patterns 110 may be extended in the first direction D1, on the semiconductor substrate 100. The insulating gapfill patterns 110 may cover side surfaces of the bit lines BL and side surfaces of the first insulating isolation patterns STI1. The insulating gapfill patterns 110 may be formed of or include one of silicon oxide, silicon oxynitride, or insulating materials, which are formed using a spin-on-glass (SOG) technology.

After the formation of the insulating gapfill patterns 110, a second trench T2 may be formed by removing the second sacrificial line pattern 105. Here, the side surfaces of the first sacrificial patterns 31, the side surfaces of the channel patterns SP, and the side surfaces of the interlayer insulating patterns ILD may be exposed to the second trenches T2.

Next, the first sacrificial patterns 31, which are exposed to the second trenches T2, may be removed to form fifth horizontal regions HR5 exposing the buffer patterns 40.

The formation of the fifth horizontal regions HR5 may include isotropically etching the first sacrificial patterns 31 using an etching process having an etch selectivity with respect to the semiconductor substrate 100, the channel patterns SP, and the interlayer insulating patterns ILD. During the isotropic etching of the first sacrificial patterns 31, the buffer patterns 40 may be used as an etch stop layer.

The fifth horizontal regions HR5 may be formed between the interlayer insulating patterns ILD and the channel patterns SP in a vertical direction and between the second insulating isolation patterns STI2 a horizontal direction.

Next, portions of the channel patterns SP exposed to the fifth horizontal regions HR5 may be doped with impurities (e.g., phosphorus or boron) of the first conductivity type. Accordingly, the second dopant regions (e.g., see SD2 of FIGS. 3A and 3B) may be formed in the channel patterns SP. A process of forming the second dopant regions and subsequent processes will be described in more detail with reference to FIGS. 14A to 14E.

Figure 13A:
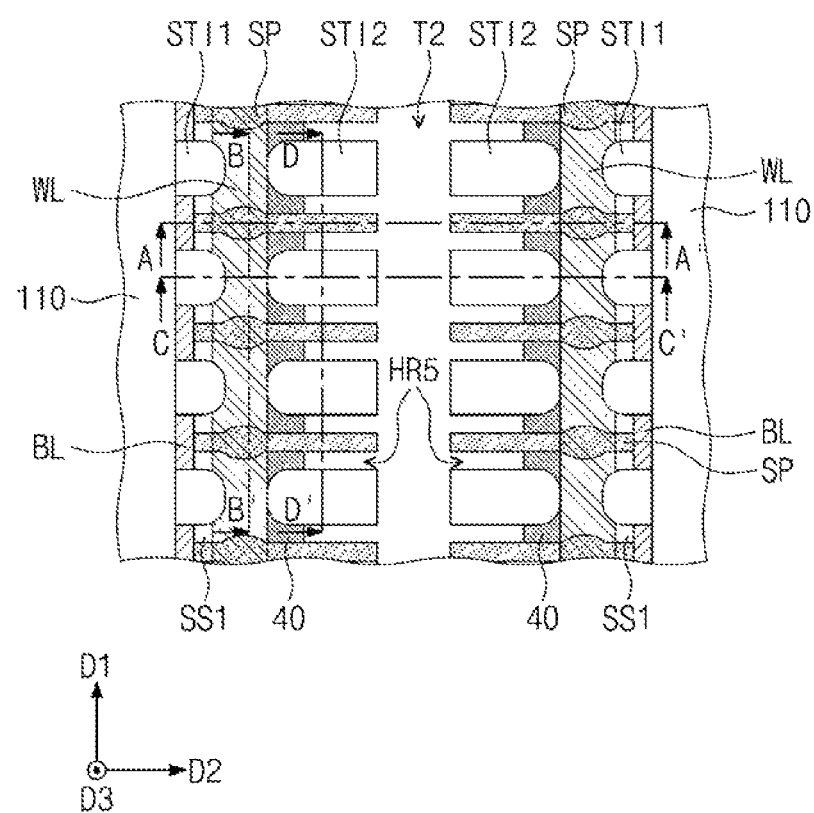
Figure 13B:
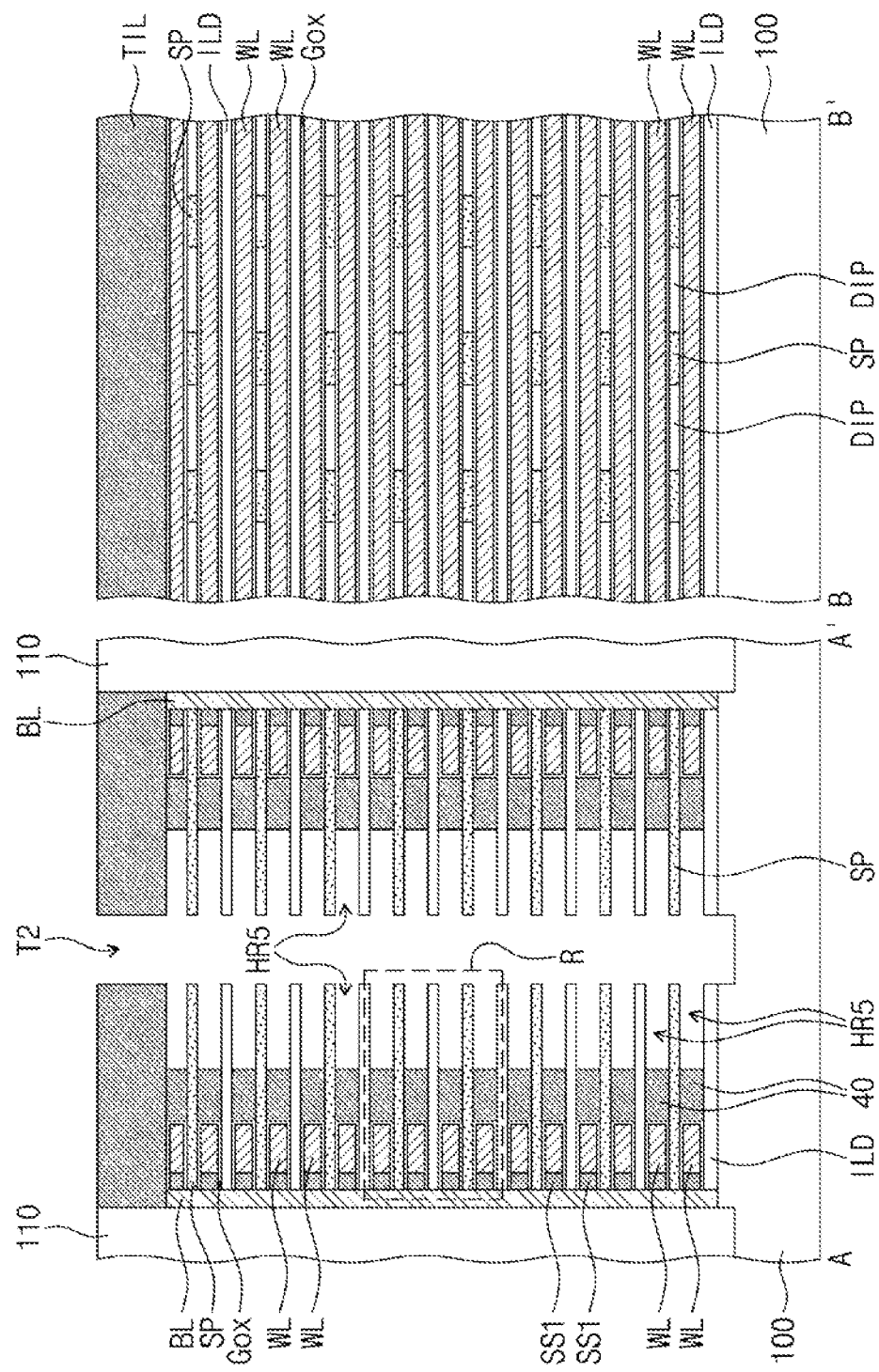
Figure 13C:
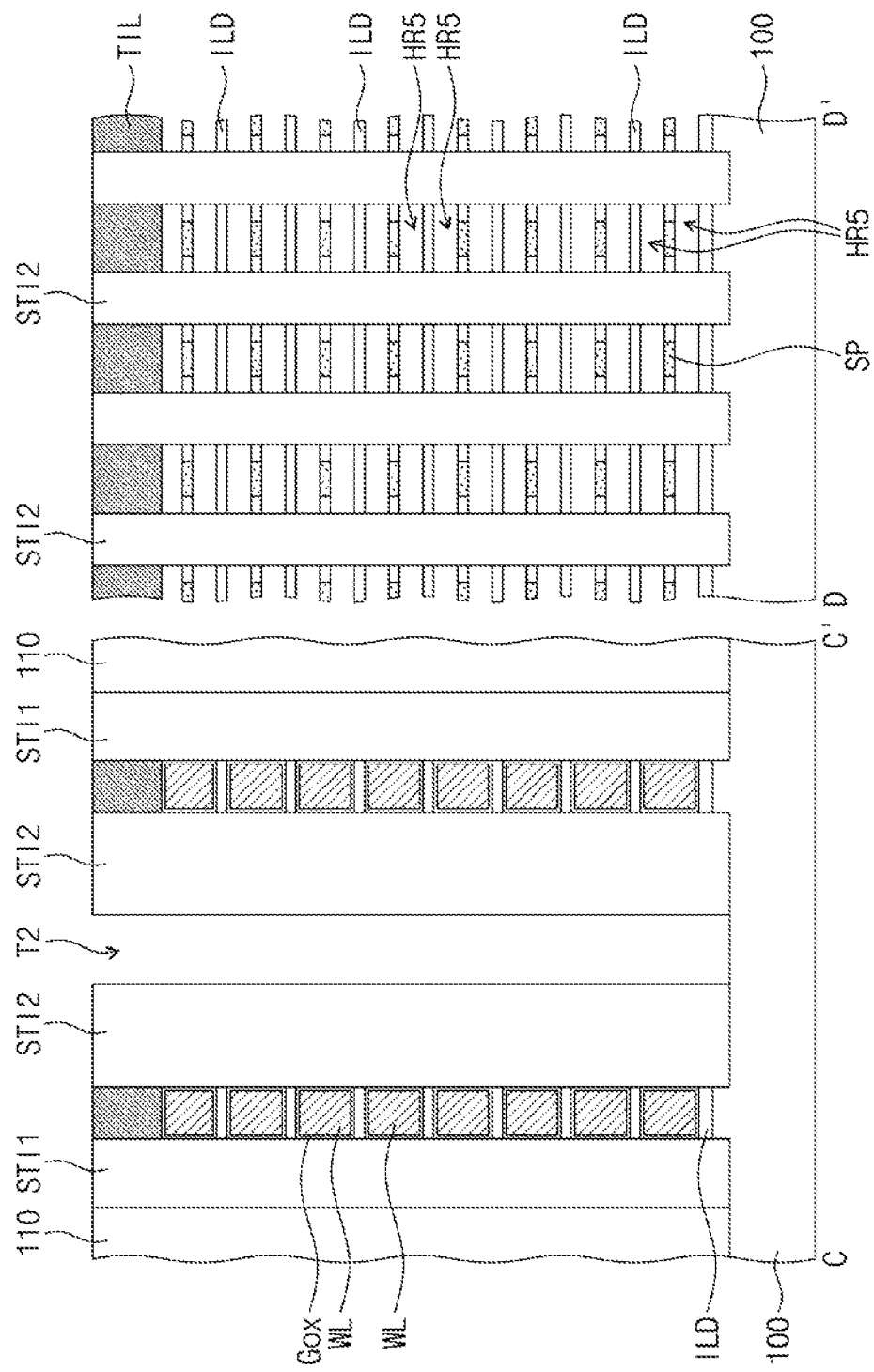
Figure 13D:
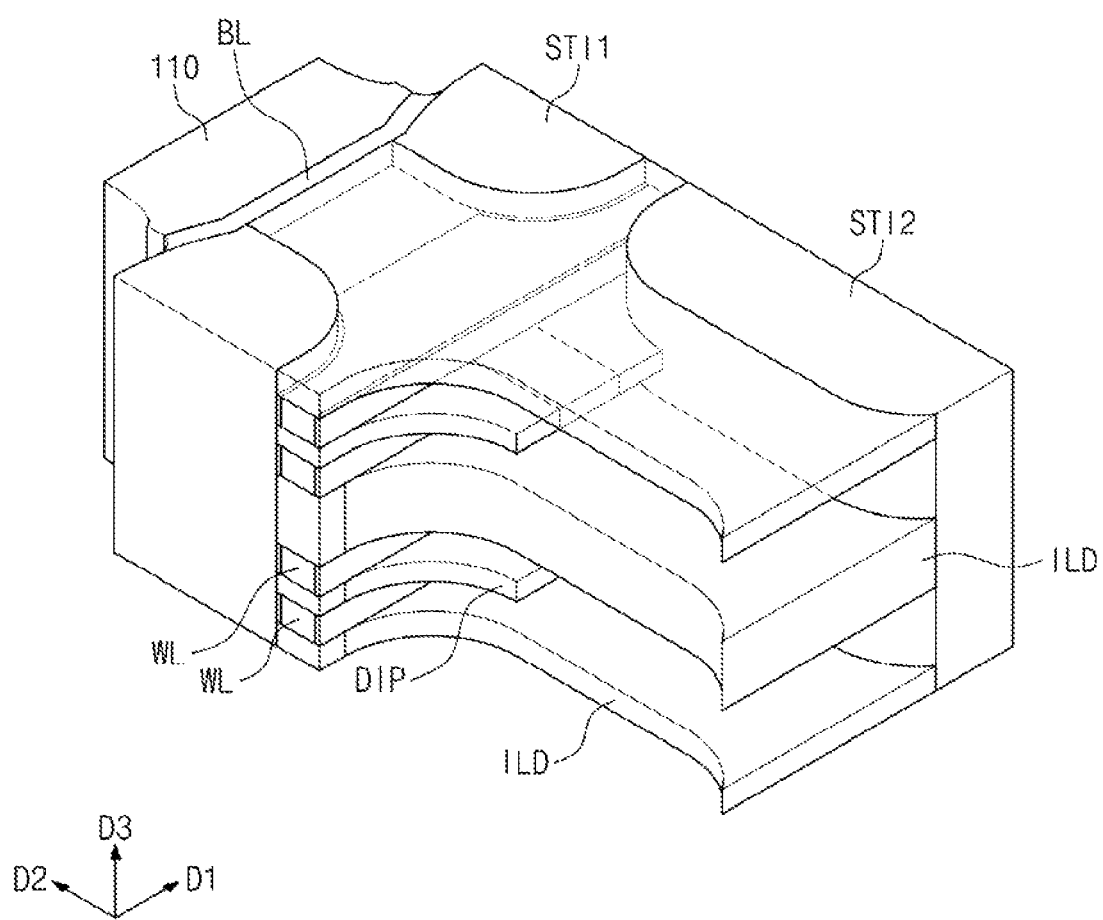

FIGS. 14A to 14E are sectional views illustrating a method of forming dopant regions of a semiconductor memory device according to an example embodiment and corresponding to a portion 'R' of FIG. 13B.

Figure 14A:
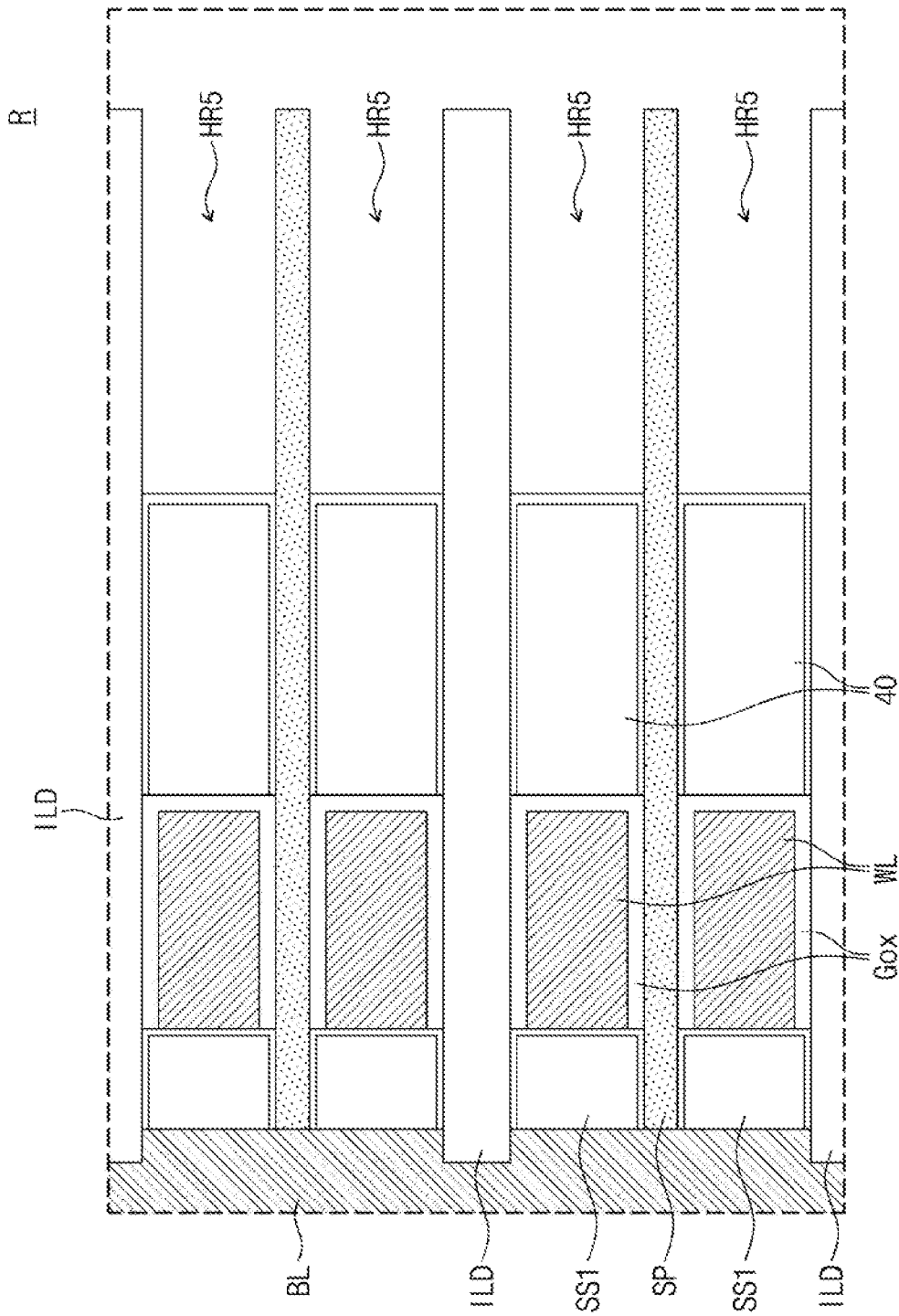
FIGS. 14A to 14E are sectional views illustrating a method of forming dopant regions of a semiconductor memory device according to an example embodiment and corresponding to a portion 'R' of FIG. 13B.

Referring to FIG. 14A, the fifth horizontal regions HR5 may be formed between the interlayer insulating patterns ILD and the channel patterns SP to expose the buffer patterns 40, as previously described with reference to FIGS. 13A, 13B, 13C, and 13D.

Next, portions of the channel patterns SP, which are exposed to the fifth horizontal regions HR5, may be etched to reduce a length of the channel patterns SP in the second direction D2. Thus, after the formation of the fifth horizontal regions HR5, portions of the channel patterns SP may be isotropically etched. Thus, the channel patterns SP may have side surfaces that are aligned to side surfaces of the buffer patterns 40.

Figure 14B:
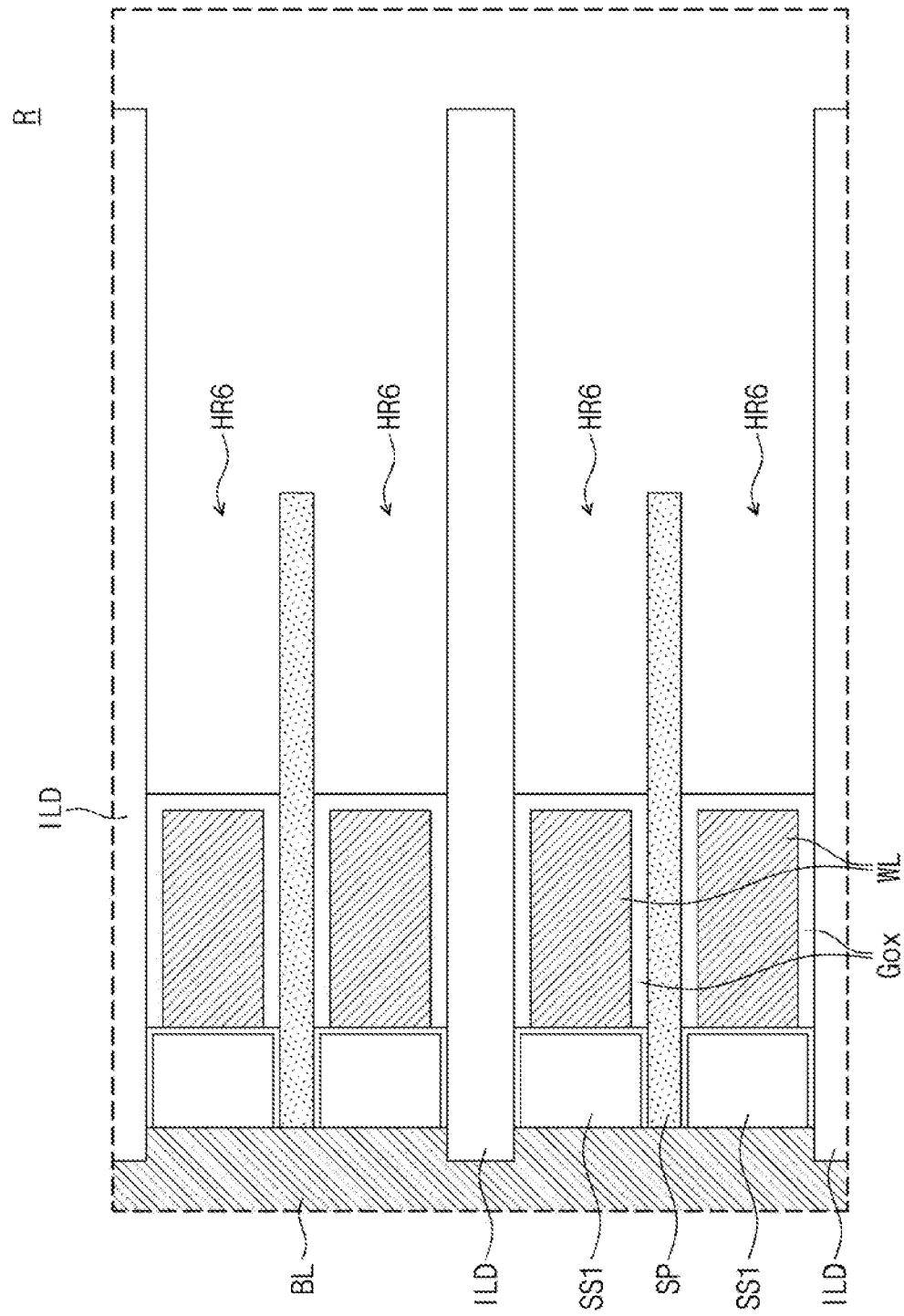

Referring to FIG. 14B, after reducing the length of the channel patterns SP, the buffer patterns 40 may be removed to form sixth horizontal regions HR6 exposing top and bottom surfaces of portions of the channel patterns SP and exposing the gate insulating layer Gox.

Figure 14C:
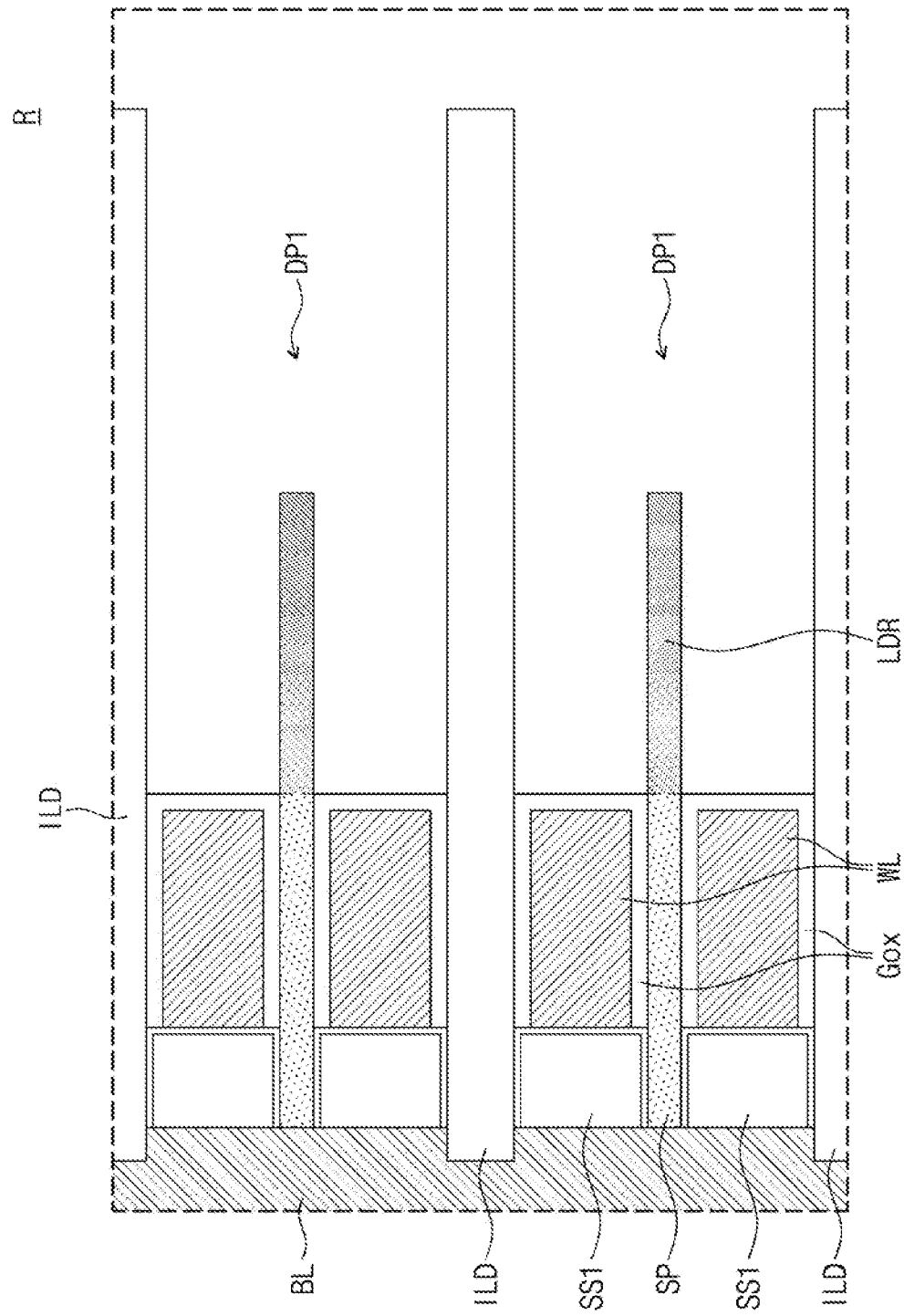

Referring to FIG. 14C, a first doping process DP1 may be performed to dope portions of the channel patterns SP, which are exposed to the sixth horizontal regions HR6, with the dopants (e.g., phosphorus (P) or boron (B)) of the first conductivity type. Accordingly, low concentration dopant regions LDR may be formed in the portions of the channel patterns SP.

The first doping process DP1 may be performed to inject dopants, which are of the first conductivity type and are provided in the form of gas or ions, into the channel patterns SP through the second trench T2 and the sixth horizontal regions HR6. The low concentration dopant region LDR may be self-aligned to a side surface of the word line WL by the first doping process DP1.

In an example embodiment, the first doping process DP1 may be selected from a gas phase doping (GPD) process, a beam line ion implantation process, or a plasma-assisted doping (PLAD) process.

Figure 14D:
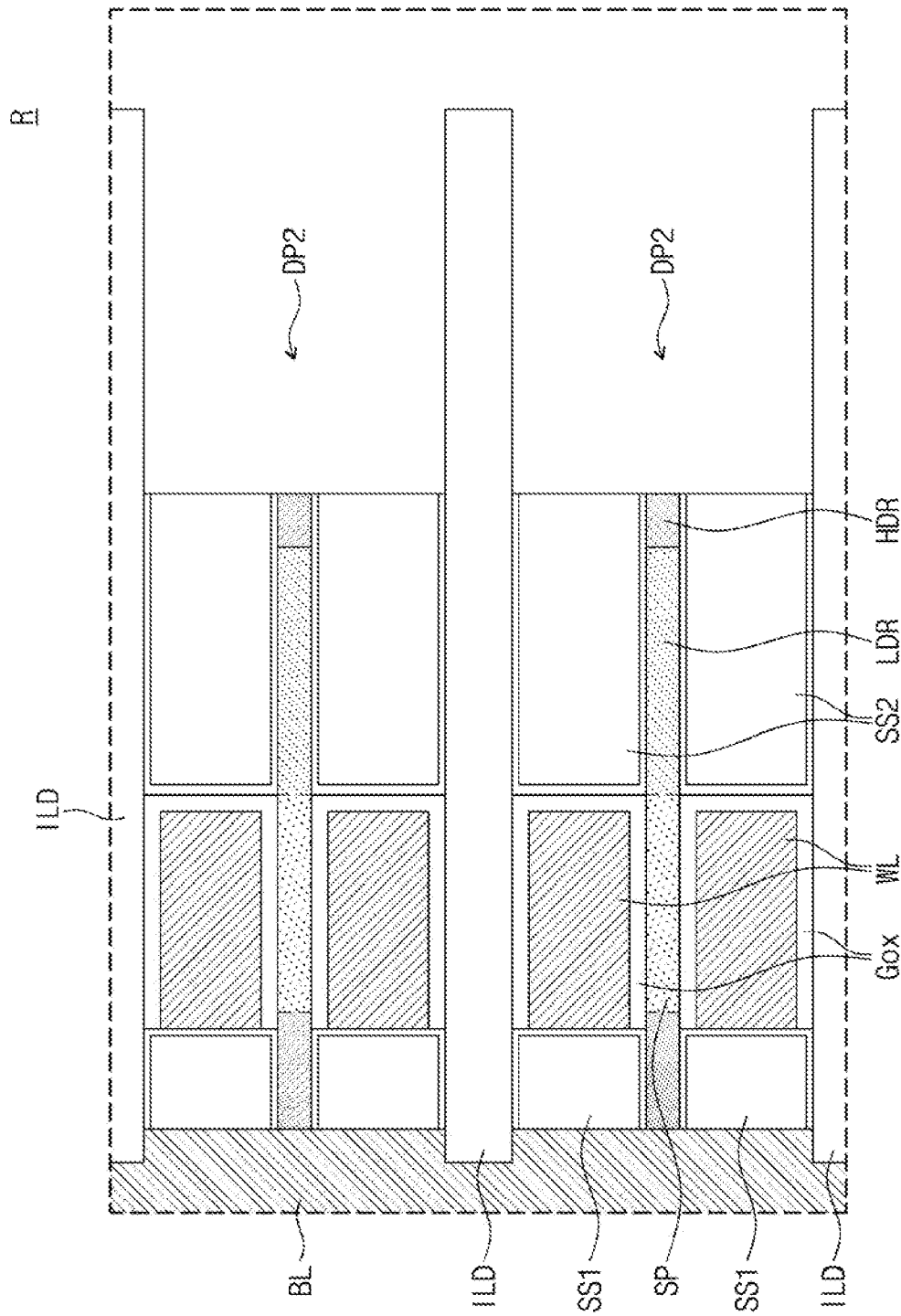

Referring to FIG. 14D, after the formation of the low concentration dopant regions LDR, the second spacer insulating patterns SS2 may be formed to fill the sixth horizontal regions HR6. The formation of the second spacer insulating patterns SS2 may include forming a spacer insulating layer on inner side surfaces of the second trenches T2 to fill the sixth horizontal regions HR6, and removing the spacer insulating layer from the second trenches T2 to expose the side surfaces of the channel patterns SP. The spacer insulating layer may be etched by an isotropic etching process having an etch selectivity with respect to the interlayer insulating patterns ILD and the channel patterns SP.

After the formation of the second spacer insulating patterns SS2, a second doping process DP2 may be performed to inject the dopants (e.g., phosphorus (P) or boron (B)) of the first conductivity type into portions of the channel patterns SP exposed to the second trench T2. The dopants in the second doping process DP2 may be the same as the dopants in the first doping process DP1, and a dopant concentration in the second doping process DP2 may be higher than a dopant concentration in the first doping process DP1. Accordingly, a high concentration dopant region HDR may be formed in a portion of the low concentration dopant region LDR adjacent to the second trench T2.

The second doping process DP2 may be selected from a gas phase doping (GPD) process, a beam line ion implantation process, or a plasma-assisted doping (PLAD) process.

Figure 14E:
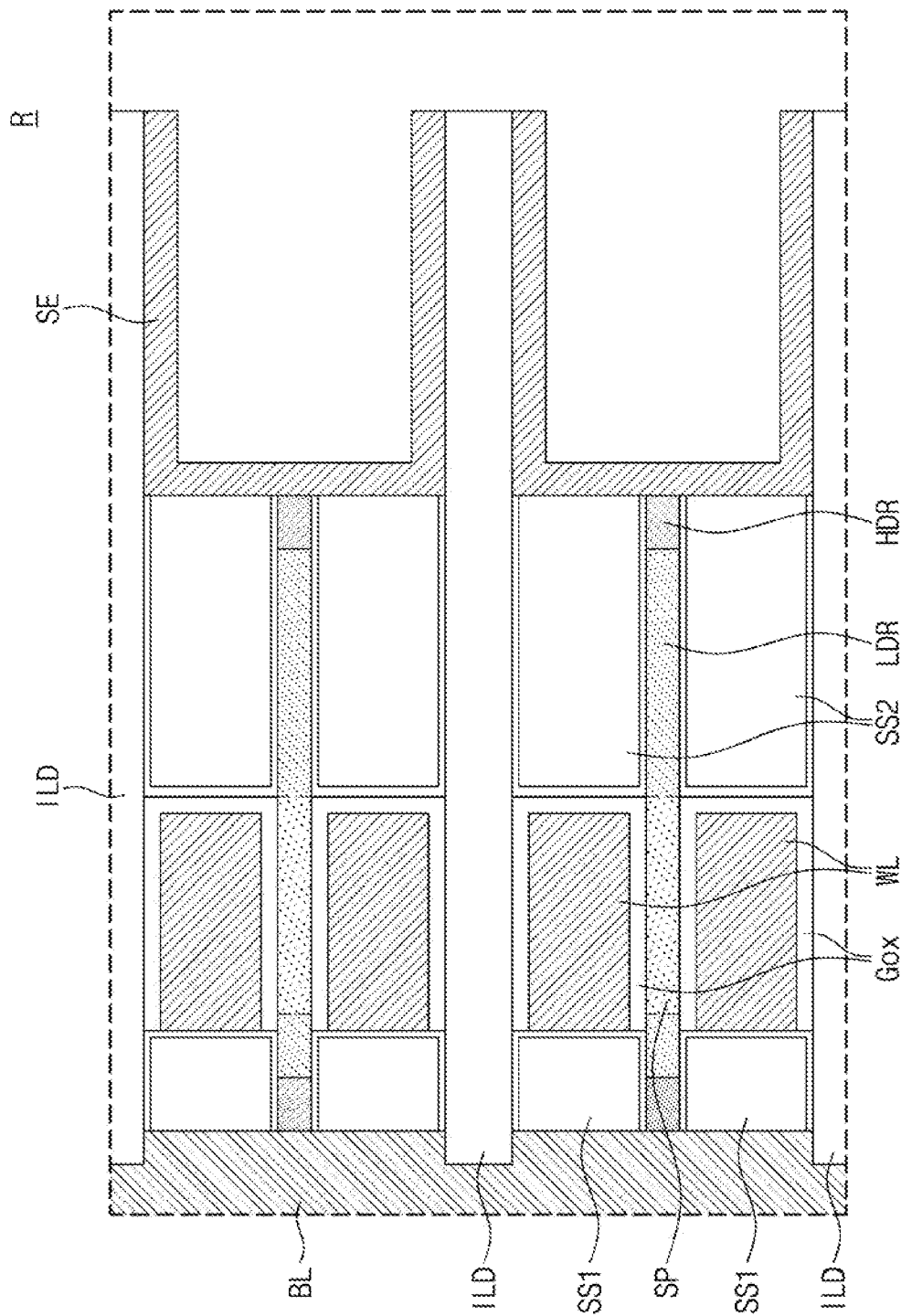

Referring to FIG. 14E, after the formation of the high concentration dopant region HDR, the storage electrodes SE may be locally formed in the sixth horizontal regions HR6.

The formation of the storage electrodes SE may include depositing a conductive layer to conformally cover inner surfaces of the fifth horizontal regions HR5 and inner surfaces of the second trenches T2, and removing portions of the conductive layer, which is deposited on the inner surfaces of the second trenches T2, to locally leave conductive patterns in the fifth horizontal regions HR5.

The storage electrodes SE may be spaced apart from each other in the first direction D1, the second direction D2, and the third direction D3. The storage electrodes SE may be in contact with the channel patterns SP, which are exposed in the fifth horizontal regions HR5. Each of the storage electrodes SE may define an empty space in the fifth horizontal regions HR5. Thus, each of the storage electrodes SE may have a long axis parallel to the second direction D2 and may have a hollow cylinder shape. In another implementation, the storage electrode SE may be a pillar-shaped pattern having a long axis parallel to the second direction D2. The storage electrode SE may be formed of or include at least one of metallic materials, metal nitride materials, or metal silicide materials.

Thereafter, the capacitor dielectric layer CIL may be formed to conformally cover the fifth horizontal regions HR5 provided with the storage electrodes SE, and the plate electrode PE may be formed to fill the fifth horizontal regions HR5, in which the storage electrodes SE and the capacitor dielectric layer CIL are formed, and the second trenches T2.

As described above, embodiments relate to a three-dimensional semiconductor memory device that may provide an improved reliability property and an increased integration density.

According to an example embodiment, in each of channel patterns, which are three-dimensionally arranged, a dopant region, which is in contact with a conductive material, may include a high concentration region and a low concentration region. Accordingly, it may be possible to prevent or suppress a gate induced drain leakage (GIDL) and/or prevent an effective channel length from being increased in a unit memory cell of a memory cell array of a three-dimensional structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a word line, which extends in a first direction parallel to a top surface of a semiconductor substrate;
a channel pattern, that crosses the word line and has a long axis in a second direction parallel to the top surface of the semiconductor substrate;
a bit line, which extends in a third direction perpendicular to the top surface of the semiconductor substrate and is in contact with a first side surface of the channel pattern; and
a data storage element, which is in contact with a second side surface of the channel pattern opposite to the first side surface, wherein:
the channel pattern includes a first dopant region adjacent to the bit line, a second dopant region adjacent to the data storage element, and a channel region provided between the first and second dopant regions and overlapping the word line,
at least one of the first and second dopant regions includes a low concentration region, which is adjacent to the channel region, and a high concentration region, which is spaced apart from the channel region,
a distance between the bit line and the channel region is smaller than a distance between the data storage element and the channel region, when measured in the second direction, and
for whichever of the first dopant region and second dopant region includes a low concentration region and a high concentration region, a length of the low concentration region is larger than a length of the high concentration region, when measured in the second direction.

2. The semiconductor memory device as claimed in claim 1, wherein the channel pattern includes a center portion and edge portions,
the center portion is disposed between the edge portions, and
a width of the center portion in the first direction is larger than widths of the edge portions in the first direction.

3. The semiconductor memory device as claimed in claim 1, wherein the low concentration region overlaps a portion of the word line.

4. The semiconductor memory device as claimed in claim 1, wherein a length of the channel region is smaller than a width of the word line, when measured in the second direction.

5. The semiconductor memory device as claimed in claim 1, wherein the first and second dopant regions include dopants of the same conductivity type.

6. The semiconductor memory device as claimed in claim 1, wherein the word line crosses a top surface and a bottom surface of the channel region of the channel pattern.

7. The semiconductor memory device as claimed in claim 1, wherein:
the first dopant region includes a first low concentration region and a first high concentration region, and the first high concentration region is in contact with the bit line, and
the second dopant region includes a second low concentration region and a second high concentration region, and the second high concentration region is in contact with the data storage element.

8. The semiconductor memory device as claimed in claim 7, wherein:
the first low concentration region overlaps the word line in the third direction,
the second low concentration region overlaps the word line in the third direction, and
an overlap length in the second direction between the word line and the first low concentration region is different from an overlap length in the second direction between the word line and the second low concentration region.

9. The semiconductor memory device as claimed in claim 1, further comprising:
a first spacer pattern provided between the bit line and the word line to enclose the first dopant region of the channel pattern; and
a second spacer pattern provided between the data storage element and the word line to enclose the second dopant region of the channel pattern.

10. A semiconductor memory device, comprising:
a stack including word lines and interlayer insulating patterns, which are alternatingly stacked on a semiconductor substrate, the word lines extending in a first direction parallel to a top surface of the semiconductor substrate;
channel patterns crossing the word lines, having a long axis in a second direction, and disposed on the semiconductor substrate to be spaced apart from each other in the first direction and in a third direction perpendicular to the top surface of the semiconductor substrate;
bit lines extending in the third direction and spaced apart from each other in the first direction, and each of which is in contact with a corresponding set of first side surfaces of the channel patterns spaced apart from each other in the third direction; and
data storage elements respectively provided between vertically adjacent ones of the interlayer insulating patterns and each of which is in contact with a corresponding one of second side surfaces of the channel patterns opposite to the first side surfaces, wherein:
each of the channel patterns includes a first dopant region adjacent to a corresponding one of the bit lines, a second dopant region adjacent to a corresponding one of the data storage elements, and a channel region provided between the first and second dopant regions and overlapping the word lines,
each of the first dopant regions includes a first low concentration region adjacent to a corresponding one of the channel regions and a first high concentration region in contact with a corresponding one of the bit lines,
each of the second dopant regions includes a second low concentration region adjacent to a corresponding one of the channel regions and a second high concentration region in contact with a corresponding one of the data storage elements,
a length of each of the second low concentration regions is larger than a length of a corresponding one of the second high concentration regions, when measured in the second direction,
each of the first low concentration regions overlaps a first portion of a corresponding one of the word lines in the third direction,
each of the second low concentration regions overlaps a second portion of a corresponding one of the word lines in the third direction, and
a length of each of the first portions is larger than a length of a corresponding one of the second portions, when measured in the second direction.

11. The semiconductor memory device as claimed in claim 10, wherein a distance between each of the channel regions and a corresponding one of the bit lines is smaller than a distance between each of the data storage elements and a corresponding one of the channel regions, when measured in the second direction.

12. The semiconductor memory device as claimed in claim 11, wherein a concentration of dopants in each of the first low concentration regions of the first dopant regions is substantially equal to a concentration of dopants in a corresponding one of the second low concentration regions of the second dopant regions.

13. The semiconductor memory device as claimed in claim 10, further comprising:
first spacer patterns, each of which is provided between a corresponding one of the bit lines and a corresponding one of the word lines to enclose a corresponding one of the first dopant regions of the channel patterns; and
second spacer patterns, each of which is provided between a corresponding one of the data storage elements and a corresponding one of the word lines to enclose a corresponding one of the second dopant regions of the channel patterns.

14. The semiconductor memory device as claimed in claim 10, further comprising:
first insulating isolation patterns spaced apart from each other in the first direction and provided between the bit lines; and
second insulating isolation patterns spaced apart from each other in the first direction and provided between the data storage elements,
wherein the first and second insulating isolation patterns extend in the third direction to penetrate the stack.

15. The semiconductor memory device as claimed in claim 14, wherein a width of each of the word lines measured in the second direction is smaller between the first and second insulating isolation patterns than on a corresponding one of the channel patterns.

16. The semiconductor memory device as claimed in claim 10, wherein each of the data storage elements includes:
a storage electrode, which is in contact with a corresponding one of the second side surfaces of the channel patterns and is parallel to the top surface of the semiconductor substrate;
a corresponding part of a dielectric layer conformally covering the storage electrode; and
a corresponding part of a plate electrode on the dielectric layer.

17. A semiconductor memory device, comprising:
first and second stacks disposed on a semiconductor substrate, each of the first and second stacks including word lines, which extend in a first direction and are stacked on the semiconductor substrate with interlayer insulating patterns interposed therebetween;
channel patterns crossing the word lines, having a long axis in a second direction, and disposed on the semiconductor substrate to be spaced apart from each other in the first and second directions and in a third direction perpendicular to a top surface of the semiconductor substrate;
bit lines extending in the third direction and spaced apart from each other in the first direction, the bit lines including first bit lines crossing the word lines of the first stack, and second bit lines crossing the word lines of the second stack;
first storage electrodes provided between the interlayer insulating patterns of the first stack;
second storage electrodes provided between the interlayer insulating patterns of the second stack;
a plate electrode provided between the first and second stacks to cover the first and second storage electrodes in common;
a dielectric layer between the first and second storage electrodes and the plate electrode;
first insulating isolation patterns spaced apart from each other in the first direction, and provided between the first bit lines and between the second bit lines; and
second insulating isolation patterns spaced apart from each other in the first direction, and provided between the first storage electrodes and between the second storage electrodes, wherein:

each of the channel patterns includes a first dopant region adjacent to a corresponding one of the bit lines, a second dopant region adjacent to a corresponding one of the first and second storage electrodes, and a channel region provided between a corresponding one of the first dopant regions and a corresponding one of second dopant regions and overlapping a corresponding one of the word lines, in each of the channel patterns, either the first dopant region or the second dopant region includes both a first low concentration region and a first high concentration region, and the first low concentration region is adjacent to a corresponding one of the channel regions, and the first high concentration region is spaced apart from the one of the channel regions, each of the channel patterns includes a center portion and edge portions, and the center portion is disposed between the edge portions, a width of each of the center portions in the first direction is larger than widths of corresponding two of the edge portions in the first direction, and wherein a length of each of the first low concentration regions is larger than a length of a corresponding one of the first high concentration regions, when measured in the second direction.

18. The semiconductor memory device as claimed in claim 17, wherein a distance between each of the bit lines and a corresponding one of the channel regions is smaller than a distance between each of the first and second storage electrodes and a corresponding one of the channel regions, when measured in the second direction.

19. The semiconductor memory device as claimed in claim 17, further comprising:

first spacer patterns, each of which is provided between a corresponding one of the bit lines and a corresponding one of the word lines to enclose a corresponding one of the first dopant regions of the channel patterns; and second spacer patterns, each of which is provided between a corresponding one of the first and second storage electrodes and a corresponding one of the word lines to enclose a corresponding one of the second dopant regions of the channel patterns.

20. The semiconductor memory device as claimed in claim 17, wherein:

each of the first dopant regions includes the first low concentration region and the first high concentration region, and the first high concentration region is in contact with a corresponding one of the bit lines, each of the second dopant regions includes a second low concentration region and a second high concentration region, and the second high concentration region in contact with a corresponding one of the first and second storage electrodes, each of the second low concentration regions overlaps a second portion of a corresponding one of the word lines in the third direction, and an extent of the overlap between the word line and the second low concentration region, measured along a direction from the first low concentration region toward the second low concentration region, is greater than an extent of any overlap between the word line and the first low concentration region, measured along the direction from the first low concentration region toward the second low concentration region.

* * * * *